US010816705B2

(12) United States Patent
Moldovan

(10) Patent No.: US 10,816,705 B2
(45) Date of Patent: Oct. 27, 2020

(54) SUPER-HIGH ASPECT RATIO DIFFRACTIVE OPTICS FABRICATED BY BATCH-PROCESSING

(71) Applicant: ALCORIX CO., Plainfield, IL (US)

(72) Inventor: Nicolaie A. Moldovan, Plainfield, IL (US)

(73) Assignee: ALCORIX CO., Plainfield, IL (US)

( * ) Notice: Subject to any disclaimer, the term of this patent is extended or adjusted under 35 U.S.C. 154(b) by 27 days.

(21) Appl. No.: 16/204,446

(22) Filed: Nov. 29, 2018

(65) Prior Publication Data

US 2019/0154892 A1 May 23, 2019

Related U.S. Application Data

(63) Continuation-in-part of application No. 15/363,950, filed on Nov. 29, 2016, now Pat. No. 10,183,375.
(Continued)

(51) Int. Cl.
*G02B 5/18* (2006.01)
*H01L 21/321* (2006.01)
(Continued)

(52) U.S. Cl.
CPC ...... *G02B 5/1876* (2013.01); *C23C 16/45555* (2013.01); *G02B 3/08* (2013.01);
(Continued)

(58) Field of Classification Search
CPC .. G02B 5/1876; G02B 3/08; C23C 16/45555; G21K 1/062; G21K 1/067; G21K 2201/067; H01L 21/32115; H01L 21/7684
(Continued)

(56) References Cited

U.S. PATENT DOCUMENTS 7,365,918 B1 4/2008 Yun et al.
9,159,574 B2 10/2015 Yu et al.
(Continued)

FOREIGN PATENT DOCUMENTS

| EP | 3282294 | 2/2018 |
| WO | 2004010228 | 1/2004 |
| WO | 2018029348 | 2/2018 |

OTHER PUBLICATIONS

Chang, C., and Sakdinawat, A., "Ultra-high aspect ratio high-resolution nanofabrication for hard X-ray diffractive optics", Nature Communications, 5:4243 {2014) doi: 10.1038/ncomms5243; published Jun. 27, 2014.
(Continued)

*Primary Examiner* — Collin X Beatty
(74) *Attorney, Agent, or Firm* — Leber IP Law; Sarah May Gates

(57) ABSTRACT

A batch processing method for fabrication of diffractive optics is disclosed, having applicability to high resolution ultra-high aspect ratio Fresnel Zone Plates for focusing of X-rays or gamma-rays having energies up to hundreds of keV. An array of precursor forms comprising columns is etched into a planar substrate. After sidewall smoothing, a nanolaminate, comprising a sequence of alternating layers of different complex refractive index, is deposited on the sidewall of each column by atomic layer deposition (ALD), to define a specified diffractive line pattern around each column, to form a binary or higher order diffractive optic. After front surface planarization and thinning of the substrate to expose first and second surfaces of the diffractive line pattern of each diffractive optic, the height h in the propagation direction provides a designed absorption difference and/or phase shift difference between adjacent diffrac-
(Continued)

tive lines. Optionally, post-processing enhances mechanical, thermal, electrical and optical properties.

20 Claims, 13 Drawing Sheets

Related U.S. Application Data

(60) Provisional application No. 62/302,352, filed on Mar. 2, 2016.

(51) Int. Cl.
| | |
|---|---|
| *H01L 21/768* | (2006.01) |
| *G21K 1/06* | (2006.01) |
| *G02B 3/08* | (2006.01) |
| *C23C 16/455* | (2006.01) |

(52) U.S. Cl.
CPC ............. *G21K 1/062* (2013.01); *G21K 1/067* (2013.01); *H01L 21/32115* (2013.01); *H01L 21/7684* (2013.01); *G21K 2201/067* (2013.01)

(58) Field of Classification Search
USPC .......................................................... 359/576
See application file for complete search history.

(56) References Cited

U.S. PATENT DOCUMENTS

| | | | |
|---|---|---|---|
| 9,360,603 B2 | 6/2016 | Schuetz et al. | |
| 9,366,786 B2 | 6/2016 | Je et al. | |
| 2015/0376798 A1* | 12/2015 | Sakdinawat | ........ B81C 1/00619 216/51 |
| 2016/0086681 A1 | 3/2016 | Leung et al. | |

OTHER PUBLICATIONS

Moldovan, Nicolaie A., "Batch Produced X-Ray Focusing Devices for 20-100 keV Photon Energies", Project Outcome Report for Federal Award ID No. 1648219, published Feb. 13, 2018, available online at Research.gov, NSF Award Highlights, Research Spending and Results, https:l/www.research.gov/research-portal/appmanager/base/desktop?_nfpb=true&_eventName=viewQuickSearchFormEvent_so_rsr.
D. Habs et al., "Refractive Index of Silicon at ? Ray Energies", Phys. Rev. Lett. 108, 184802—Published May 1, 2012.
B. Lai et al., "Hard x-ray phase zone plate fabricated by lithographic techniques", Appl. Phys. Lett. 61(16), 1877-79 (Nov. 1992).
A Stein et al., "Diffractive x-ray optics using production fabrication methods", J. Vac. Sci. Technol. B 21.1., Jan./Feb. 2003, 214-219.
K. Jefimov et al., "Fabrication of Fresnel zone plates for hard X-rays", Microelectronic Engineering 84 (2007) 1467-1470.
J. Reinspach et al., "13 nm high-efficiency nickel-germanium soft x-ray zone plates", J. Vac. Sci. Technol. B, vol. 29, No. 1, Jan./Feb. 2011, 011012-1-011012-4.
C. David et al., "Nanofocusing of hard X-ray free electron laser pulses using diamond based Fresnel zone plates", Scientific Reports, (2011) 1: 57.
W. Yun et al., "Nanometer focusing of hard x rays by phase zone plates", Rev. of Sci. Instruments 70, 5, (1999), 2238-2241.
K. Keskinbora et al., "Ion beam lithography for Fresnel zone plates in X-ray microscopy", Optics Express, vol. 21, No. 10 (2013) 11747-11756.
K. Saitoh et al., "Characterization of sliced multilayer zone plates for hard x rays", Rev. of Sci. Instruments 60, 7, (1989), 1519-1523.
M. Yasumoto et al., "Suppression of Corrugated Boundaries in Multilayer Fresenel Zone Plate for Hard X-Ray Synchrotron Radiation using Cylindrical Slit", Japanese Journal of Applied Physics, 40, pp. 4747-4748.
H. Yan, et al., "Two dimensional hard x-ray nanofocusing with crossed multilayer Laue lenses", Optics express vol. 19, No. 16, (2011), 15069-15076.
S.M. George, "Atomic Layer Deposition: An Overview", Chem. Rev., 2010, 110 (1), pp. 111-131.
M. Mayer et al., "Multilayer Fresnel zone plate for soft X-ray microscopy resolves sub-39 nm structures", Ultramicroscopy 111 (2011) 1706-1711.
Z. Huang, "Metal-Assisted Chemical Etching of Silicon: A Review: In memory of Prof. Ulrich Gösele", Adv. Mater. 2011, 23, 285-308.
Y. Oh, "Magnetically Guided Nano—Micro Shaping and Slicing of Silicon", Nano Lett. 2012, 12, 2045-2050.
K.-Y. Weng et. al. "Planarize the sidewall ripples of silicon deep reactive ion etching", NSTI-Nanotech 2004, www.nsti.org, ISBN 0-9728422-7-6 vol. 1, 2004).
J.D. Ferguson et al., "Atomic layer deposition of boron nitride using sequential exposures of BCI3 and NH3", Thin Solid Films 413 (2002) 16-25.
J.W. Elam et al., "Nucleation and growth during tungsten atomic layer deposition on SiO2 surfaces", Thin Solid Films 386 2001 41-52.
T. Aaltonen et al., "Atomic Layer Deposition of Iridium Thin Films", J. Electrochem. Soc. 2004, vol. 1, 8, pp. G489-G492.
S.-J. Ding et al., "Atomic layer deposition of high-density Pt nanodots on Al2O3 film using (MeCp)Pt(Me)3 and O2 precursors for nonvolatile memory applications", Nanoscale Research Lett., 2013, 8:80.
M. Born and E Wolf, Principles of Optics, Sixth edition, Cambridge University Press, 1998, p. 381.
H.I. Smith, "A proposal for maskless, zone plate array nanolithography"J. Vac. Sci. Technol. B 14(6), Nov./Dec. 1996, pp. 4318-4332.
T. Salditt, et al., "X-Ray Optics on a Chip: Guiding X Rays in Curved Channels", Phys. Rev. Lett. 115, (2015), 203902.
U. T. Sanli et al., "3D Nanofabrication of High-Resolution Multilayer Fresnel Zone Plates", Adv. Sci. 2018, 1800346.
European Patent Application No. 16184001.2, "High resolution full material Fresnel zone plate array and process for its fabrication", Max-Planck-Gesellschaft, Aug. 12, 2016, 28 pages.
K. Sharma et.al., "Spatial atomic layer deposition on flexible substrates using a modular rotating cylinder reactor" J. Vac. Sci. Technol. A33(1), p. 01A132-1, Jan./Feb. 2015.
D.J.H. Emslie et.al., "Metal ALD and pulsed CVD: Fundamental reactions and links with solution chemistry", Coordination Chemistry Reviews, vol. 257, 23-24, pp. 3282-3296, Dec. 2013.
J. Maser et.al., "Coupled wave description of the diffraction by zone plates with high aspect ratios", Opt. Comm. 89, May 1, 1992, pp. 355-362.

* cited by examiner

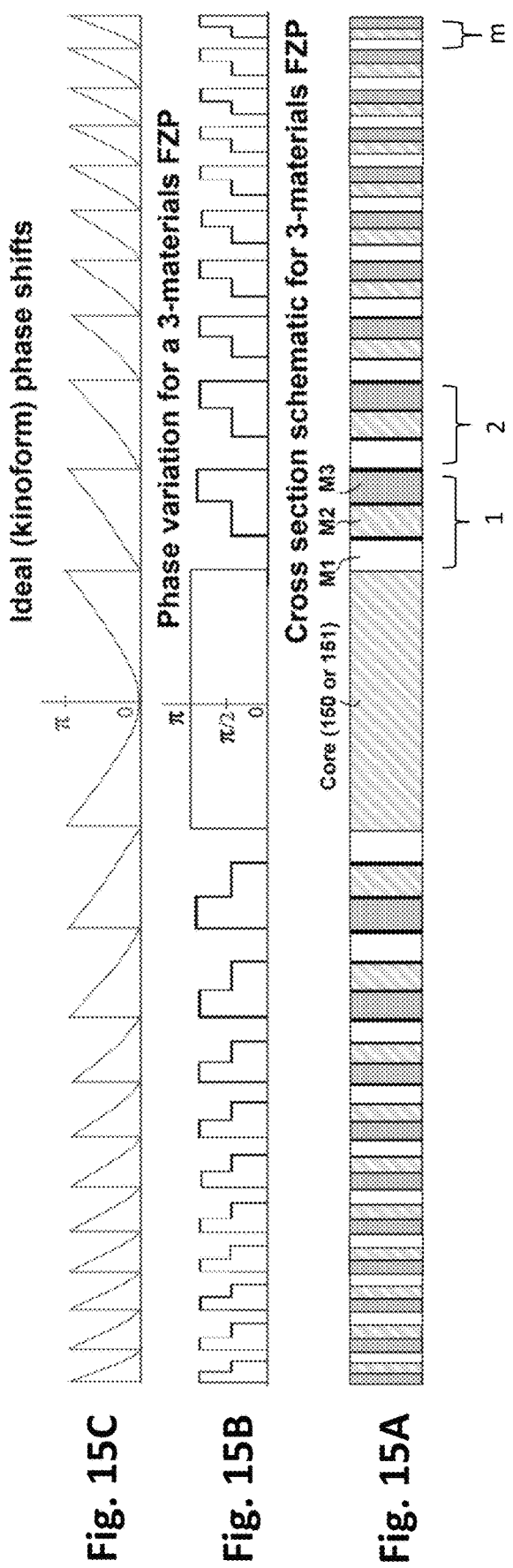

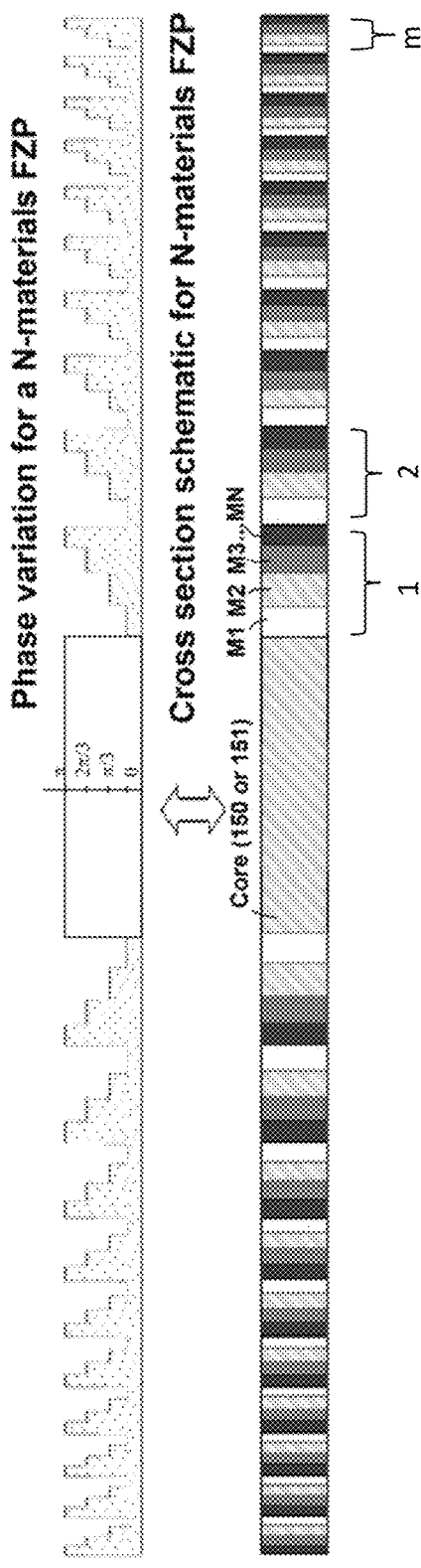
Fig. 16C Ideal (kinoform) phase shifts
Fig. 16B Phase variation for a N-materials FZP
Fig. 16A Cross section schematic for N-materials FZP Table 1

| Photon or Particle energy (keV) | Boron Nitride Coefficient of Index of Refraction $\delta_{BN}$ | Tungsten Coefficient of Index of Refraction $\delta_W$ | Iridium Coefficient of Index of Refraction $\delta_{Ir}$ | Platinum Coefficient of Index of Refraction $\delta_{Pt}$ | Height of the zone $h_{\pi\,W\text{-}BN}$ (μm) | Height of the zone $h_{\pi\,Ir\text{-}BN}$ (μm) | Height of the zone $h_{\pi\,Pt\text{-}BN}$ (μm) | Tungsten/ Boron Nitride Aspect Ratios $A_{\pi\,W\text{-}BN}$ | Iridium/ Boron Nitride Aspect Ratios $A_{\pi\,Ir\text{-}BN}$ | Platinum/ Boron Nitride Aspect Ratios $A_{\pi\,Pt\text{-}BN}$ |
|---|---|---|---|---|---|---|---|---|---|---|
| 10 | 4.22E-06 | 2.78E-05 | 3.41E-05 | 3.28E-05 | 2.6 | 2.1 | 2.2 | 526 | 414 | 434 |
| 30 | 4.68E-07 | 3.55E-06 | 4.11E-06 | 3.93E-06 | 6.7 | 5.7 | 6.0 | 1342 | 1134 | 1195 |
| 50 | 1.69E-07 | 1.26E-06 | 1.47E-06 | 1.40E-06 | 11.3 | 9.6 | 10.1 | 2266 | 1911 | 2012 |
| 100 | 4.21E-08 | 3.19E-07 | 3.69E-07 | 3.52E-07 | 22.4 | 19.0 | 20.0 | 4479 | 3792 | 4003 |
| 200 | 1.05E-08 | 7.98E-08 | 9.24E-08 | 8.82E-08 | 44.8 | 37.9 | 39.9 | 8951 | 7570 | 7978 |

Fig. 23

SUPER-HIGH ASPECT RATIO DIFFRACTIVE OPTICS FABRICATED BY BATCH-PROCESSING

CROSS REFERENCE TO RELATED APPLICATION

This application is a continuation-in-part of U.S. patent application Ser. No. 15/363,950, filed Nov. 29, 2016, entitled "Batch-Processing Method for Super-High Aspect Ratio Diffractive Optics", which claims priority from U.S. Provisional patent application No. 62/302,352, filed Mar. 2, 2016, entitled "Batch-Processing Method for Super-High Aspect Ratio Diffractive Optics"; both applications are incorporated herein by reference in their entirety.

FIELD OF THE INVENTION

This invention relates to diffractive optics and a method of manufacturing high aspect ratio diffractive optic devices applicable to the focusing or shaping of wave fronts of very high energy electromagnetic radiation or particle beams using curved or variable-spaced diffractive lines of absorber or phase shifter materials, with sub-20 nm features and aspect ratios up to tens of thousands to one.

BACKGROUND

Many diffractive optics devices, such as those used for focusing X-rays or particle rays (elementary particles or ions), use high-aspect-ratio or free-standing curved or variable-width line grids, or, they are composed of a succession of absorption or refractive index varying absorber or phase shifter materials to manipulate the wave front through superposition of beams diffracted by individual design features of the devices. In many cases, such design features are organized in curved or straight lines of variable spacing. The phrase "diffractive lines" will be used herein to describe individual line-shaped diffractive elements of such devices. In the context of this disclosure, each diffractive optic device comprises a plurality of diffractive lines which form a specified diffractive line pattern, i.e. a pattern of diffractive lines that act collectively to provide a required functionality, such as, focusing, illuminating, imaging, field splitting, et al. For some geometries, the diffractive lines may alternatively be referred to as diffractive zones. A typical example of this type of structure is a Fresnel Zone Plate (FZP) for focusing X-rays, in which the diffractive lines of the FZP are organized in concentric circles, which may be referred to as Fresnel zones. The width of the absorber/phase shifter material lines (zones) is varied in proportion to the square root of the radius of curvature of the lines, usually from widths of a few micrometers at the center of the FZP, to a few tens of nanometers or less at the outermost zones. The characteristic performance metrics of such devices, such as focusing resolution, diffraction efficiency, spectral resolution, or other metrics, depend on the linewidth control and fidelity of the smallest dimension diffractive lines/zones and the thickness in the direction of propagation of the diffractive lines, as achievable technologically. For instance, the focusing resolution of FZPs is related to the width of the outermost circular zone, while the efficiency—defined as the energy of the beam diffracted towards the focus of interest divided by the total incident beam energy—depends on the thickness and nature of the material, as well as the accuracy of the zone pattern. It is well-known to those skilled in the art that the maximum theoretical efficiency of binary FZPs can be obtained if the phase shift difference in adjacent zones is a multiple of pi ($\pi$). For high photon energy X-rays such as 25 keV, the necessary thickness of a $\pi$-shifting material is about 4.84 $\mu$m for gold, 4.5 $\mu$m for tungsten, and 4.2 $\mu$m for iridium. If the smallest zone width is 20 nm, then the aspect ratios of such diffractive lines are 242:1, 225:1, and 210:1, respectively. Self-standing geometric objects of this aspect ratio are essentially impossible to fabricate without collapse or distortion at this time. If a material scaffold of low absorption/low refractive index is used to prevent collapse, the phase shift produced in that material has to be considered and the aspect ratio needed for a phase shift difference of $\pi$ between adjacent diffractive lines increases even more. Also, if applications are envisioned for higher photon energies, such as 20-100 keV, where X-ray producing tubes/lamps generate higher intensities due to the energy proximity of spectral absorption/emission edges of most metallic cathode electrodes of interest (including the refractory metals well-suited for X-ray emission cathodes), the aspect ratio requirements of the corresponding diffractive lines increase dramatically up to tens of thousands-to-one. The use of small laboratory-based X-ray sources such as X-ray tubes is preferable to sources such as those of expensive synchrotron radiation facilities, to allow for lower cost/smaller footprint generation of X-rays in small X-ray microscopes or diffraction devices, which then require adequate diffraction optics of super-high aspect ratios. Recently, D. Habs et al. (D. Habs et al., Phys. Rev. Lett. 108, (2012) 184802) demonstrated that the refractive indexes of materials in the gamma ($\gamma$)-ray regime (photon energies from 0.18 MeV to 2 MeV) can attain values in the $10^{-9}$-$10^{-5}$ range due to inelastic Delbrück scattering or pair creation, thus allowing for the possibility of the fabrication of diffractive optics for $\gamma$-rays, if super-high aspect ratio structures can be reliably fabricated. Thus, there exists a need for a method of greatly improving the manufacturability of high aspect-ratio diffractive optics devices comprised of appropriate phase shifting materials which are capable of addressing one or more limitations of known methods.

Several methods of manufacturing diffractive optics of high aspect ratio have been proposed and practiced. The most common manufacturing method of limited high aspect ratio diffractive optics is the use of electron beam lithography for writing the diffractive lines into an electron-beam-sensitive resist material, followed by electroforming a metal using the said resist as a mold, as taught by B. Lai et al. (B. Lai et al., Appl. Phys. Lett. 61, 1877 (1992)). Electron beam lithography followed by the etching of the substrate and filling the so-obtained mold with a metal by electroplating is also known, as taught, for example, by A. Stein et al. for the case of etching the structure into silicon (A. Stein et al., J. Vac. Sci. Technol. B 21.1., January/February 2003, 214-219), or K. Jefimov et al. for the case of polyimide (K. Jefimov et al., Microelectronic Engineering 84 (2007) 1467-1470), or J. Reinspach et al. for germanium (J. Reinspach et al., J. Vac. Sci. Technol. B, Vol. 29, No. 1, January/February 2011, 011012-1-011012-4), or C. David et al. for diamond (C. David et al., Scientific Reports, (2011) 1: 57). Electron beam lithography can be replaced by other types of lithography, such as, X-ray, ion beam, focused ion beam or particle beam lithography, followed by etching and/or electroplating (W. Yun et al., Rev. of Sci. Instruments 70, 5, (1999), 2238-2241; and K. Keskinbora et al., Optics Express, Vol. 21, No. 10 (2013) 11747-11756). The limitations of all these types of lithography and methods are the modest aspect ratios of the features that they are capable of producing. These prior art methods usually achieve an aspect ratio of 10:1, and only a few exceptions can reach aspect ratios close to about 20:1. These aspect ratios are insufficient for efficient focusing of x-rays, or particle beams of a corresponding energy. Metal-enhanced chemical etching (MACE) of silicon (Si) was reported by C. Chang and A. Sakdinawat (Nature Communications 5, 4243, (2014)) to obtain zone plates with aspect ratios as high as 40:1, but inherent difficulties are encountered with large scale uniformity and reproducibility, while the material used is restricted to Si, which has a too high absorption for a scaffold material and too low refraction index for a phase shifter material.

To overcome the aspect ratio limitation in various lithographic technologies, a method of producing diffractive optics of circular symmetry, called "sputter-and-slice" was proposed by K. Saitoh et al. (K. Saitoh et al., Rev. of Sci. Instruments 60, 7, (1989), 1519-1523). The method begins with a wire, rod, or tube, of circular cross-section, followed by deposition of a succession of alternating layers of material having different characteristics, i.e., alternating low absorbing/high absorbing material layers, or, alternating low refractive index/high refractive index material layers. Layers are deposited by sputtering from different targets in the same vacuum chamber, with rotation of the wire around its axis. The deposition times and conditions are calculated such that the thicknesses of the successively deposited layers are equal to the diffractive line width of a given position in the targeted device. Finally, the wire is sectioned and polished to form the diffractive device, such as, a Fresnel zone plate. One drawback of this method is the accentuation or amplification of radius irregularities of the central wire (i.e. the roughness or accidental other variations including particulate defects and thickness variations during the deposition) as successive layers are deposited beginning from the bare wire and proceeding to the outermost layer. A second drawback is the accumulation of the absolute error values of the deposition thicknesses of each of the inward layers as an error of placement of the next outward layer. Thus, the outermost (i.e. thinnest) layers accumulate the largest radius errors due to the amplification and accumulation of the depositional processes errors through successive layers. This error amplification process can produce defects in the final (thinnest) zone shape and placement exceeding a half-width of the layer/zone itself, rendering that portion of the diffractive line useless for focusing or adequate manipulation of phase shift of the prescribed photon or particle beam. Improvements of the sputter-and-slice method have been proposed by M. Yasumoto et al., (M. Yasumoto et al., Japanese Journal of Applied Physics, 40 (2001), pp. 4747-4748), in which the sputtering of layers onto the rotating wire is performed through a narrow slit, to minimize the roughness accentuating phenomenon. However, in order to effectively reduce the error amplification process, the slit widths have to be reduced to fractions of the wire diameter, which reduces the deposition rate to impractically low values. Another drawback of the sputter-and-slice method is that only one wire can be processed at a time, while the slicing/polishing procedures are serial and time-consuming.

A linear form of the sputter-and-slice method has been developed for one dimensional focusing lenses, in which a planar substrate is sputter-deposited with successive layers of designed thickness by moving the planar substrate below sputtering targets and then slicing and using the slices as linear half-lenses, or grouped in a symmetrical pair as linear focusing lenses, called Multi-Layer Laue Lenses (MLLs) (H. Yan, et al., Optics express Vol. 19, No. 16, (2011), 15069-15076). The method suffers from the same drawbacks as the wire-based version and can be used only for linear (one-dimensional) optics; however, it has shown relatively higher rates of success because it is easier to obtain highly planar and smoothly-polished planar surfaces rather than perfectly circular, low roughness wires or tubes.

An alternative version of the sputter-and-slice method has been developed in which the directional sputtering process onto wires is replaced by atomic layer deposition (ALD), onto wires. ALD is by nature, a highly isotropic deposition process (see review by S. M. George, Chem. Rev., 110 (1), (2010), pp 111-131). The method, reported by M. Mayer et al. (M. Mayer et al., Ultramicroscopy 111 (2011) 1706-1711), which is known as "ALD-and-slice", eliminates the roughness accentuation of the sputter-and-slice method and even produces a smoothing with succeeding depositions, does not require a rotation setup in the deposition chamber, and permits deposition onto several wires at the same time. However, this method still preserves error accumulation in layer thicknesses, but these errors are more easily kept in control, due to the more precise nature of the ALD process. A version of the ALD-and-slice method, in which successive layers are deposited into the inner cavity of a capillary tube, rather than onto a wire, was proposed by G. Schuetz et al., (United States Patent Application no. 2012/0258243 A1). This method alleviates the problem of error accumulation in the thinnest (top most) layers, since the thicker layers are deposited last, when the accumulated error is higher, but those thicker layers are also more shape and placement tolerant (in absolute values), thus, diminishing the percentage of thickness of accumulated error in the last (thicker) layers/zones. All the versions of the sputter and slice and ALD-and-slice methods preserve the drawbacks of a serial and tedious slicing and polishing procedure. An additional drawback of the ALD-and-slice method is the relative slow rate of deposition in ALD processes, which require months-long deposition times for Fresnel Zone Plates with a reasonable number of zones.

A related method was proposed by W. Yun et al. (U.S. Pat. No. 7,365,918 B1) comprising etching a cylindrical hole into a substrate and sequentially depositing layers corresponding in thickness to zone plate zones, by sputtering or ALD, and then slicing by polishing to form zone plates. In practice, for deposition by sputtering, this fabrication process would be limited by the variation of thickness of sputtered layers with the depth in the hole, inherent to the sputtering process. As mentioned above, while sequential ALD is capable of deposition of conformal layers of uniform and controlled thickness, in practice, the method of Yun et al. would be limited by the surface roughness of the cylindrical holes, which depends on the etch process used for etching the holes. For example, a deep reactive ion etching process (DRIE), such as the Bosch etch process, which is used to etch high aspect-ratio, deep, holes for microelectronics or MEMS devices, is known to create sidewall ripples, or "scalloping" of the sidewalls. Thus, the thickness of the thinnest functional zone of the diffractive optic is limited by the average roughness of the side walls, which is usually tens or hundreds of nm for most etching processes. Moreover, this method would need an accurate characterization of the diameter, sidewall tilt and surface roughness of the cylindrical hole, e.g., an accuracy of no less than half of the thinnest targeted functional zone width, which is typically ~10 nm or less. This accuracy is difficult to characterize in holes of the required depth and aspect ratio, except by destructive procedures.

Thus, there is a need for improved device structures and methods for fabrication of high aspect ratio diffractive optics, which address one or more of the above mentioned limitations of known device structures and methods.

SUMMARY OF INVENTION

Aspects of the present invention provide device structures comprising diffractive optics and methods of fabrication thereof. Device structures and methods of embodiments are disclosed, which have particular application batch-processing of high-aspect ratio diffractive optics for X-rays and gamma rays up to hundreds of keV and particle beams of corresponding energies.

One aspect of the invention provides a device structure comprising:
a diffractive optic comprising a specified diffractive line pattern, for photons of a prescribed energy or particle radiation;
the diffractive optic being supported within a planar substrate comprising a substrate material; a first part of the substrate material defining a column having a sidewall providing a core support of the diffractive optic, and a second part of the substrate material defining a supporting frame around the diffractive optic;
a nanolaminate formed on the sidewall of the column, the nanolaminate comprising at least first and second materials M1 and M2 having respective first and second complex indexes of refraction for photons or particle radiation of the prescribed energy, wherein the nanolaminate comprises a sequence of layers $(M1, M2)_1, (M1, M2)_2 \ldots (M1, M2)_m$ of thicknesses defining annular diffractive lines forming the diffractive line pattern around the column;
a filler filling a region between the diffractive line pattern and the supporting frame; and
first and second surfaces of the column, the diffractive line pattern around the column, the filler and the surrounding frame being planarized to form the planar substrate, wherein an axial height of the diffractive line pattern in a direction of propagation is defined between the first and second surfaces.

Another aspect of the invention provides a device structure comprising: a plurality of diffractive optics, each comprising a diffractive line pattern, for photons of a prescribed energy or particle radiation;
each diffractive optic being supported within a planar substrate comprising a substrate material;
a first part of the substrate material defining a plurality of columns, each having a sidewall providing a core support of one of the diffractive optics, and a second part of the substrate material defining a supporting frame around each diffractive optic,
a nanolaminate formed on the sidewall of each column, the nanolaminate comprising at least first and second materials M1 and M2 having respective first and second complex indexes of refraction for photons or particle radiation of the prescribed energy, wherein the nanolaminate comprises a sequence of layers $(M1, M2)_1, (M1, M2)_2 \ldots (M1, M2)_m$ of thicknesses defining annular diffractive lines around each column forming the diffractive line pattern of one of the diffractive optics;
   a filler filling regions between each diffractive line pattern and the supporting frame; and
   first and second surfaces of each column, the diffractive line pattern around each column, the filler and the surrounding frame being planarized to form the planar substrate, wherein an axial height of the diffractive line pattern in a direction of propagation is defined between the first and second surfaces.

The device structure may comprise a binary diffractive optic wherein the nanolaminate comprises a sequence of alternating layers of first and second materials, M1 and M2. The device structure may comprise a nanolaminate having a sequence of layers of materials M1, M2 ... MN, where N is ≥3, the materials M1 ... MN having an ordered sequence of different complex indexes of refraction at the prescribed energy or wavelength, thereby forming an Nth-order diffractive optic, with the sequence of layers being deposited in a repeating sequence M1, M2, ... MN, to form a higher order diffractive optic.

For example, in a device structure of one embodiment, the specified diffractive line pattern is a Fresnel zone pattern, and the nanolaminate defining the specified diffractive line pattern of each diffractive optic forms the Fresnel zone pattern around each column.

The diffractive line patterns, and the materials and dimensions of the diffractive optics may be selected for focusing of x-ray or gamma-ray electromagnetic radiation having a prescribed energy, e.g. a selected energy in the range from 5 keV to several hundred keV.

For example, to provide a required aspect ratio for photons or particle radiation of a prescribed energy, the thickness of thinnest deposited layers of the sequence layers is between 0.2 and 100 nm; the aspect ratio of said axial height h to said thickness of the thinnest deposited layers between 10:1 and 100,000:1.

For example, in a device structure of one embodiment, the specified diffractive line pattern is a Fresnel zone pattern, and the nanolaminate defining the specified diffractive line pattern of each diffractive optic forms the Fresnel zone pattern around each column.

Each diffractive optic may comprise a two-dimensional diffractive optic, or a one-dimensional (linear) diffractive optic. For example, for two-dimensional diffractive optics, the columns may comprise columns with circular cross-sections; columns with elliptical cross-sections; columns with simple polygonal cross-sections, such as a square cross-section or hexagonal cross-section. For example, columns may be cylindrical columns with substantially vertical sidewalls, having sidewall angle of not more than +/−0.5 degrees from vertical, or the columns may have sidewalls of a specific sidewall angle, such as +/−5° from vertical. The columns may have a shape wherein the sidewall tilt varies within −0.5 and +0.5 degrees from an average sidewall angle in the range of +/−5 degrees. For one-dimensional (linear) diffractive optics the columns may have a rectangular cross-section, e.g. to form linear mesas with a specific sidewall angle or tilt. A combination of one- and two-dimensional diffractive optics may be provided in the same substrate.

The filler may comprise a residual part of the nanolaminate formed on a sidewall of parts of the substrate material forming the supporting frame, and a filler material, such as a planarization material, filling the region between the nanolaminate defining the diffractive line pattern around each column and the residual part of the nanolaminate.

The device structure may further comprise a carrier substrate supporting the planar substrate, the carrier substrate having windows exposing each diffractive optic, wherein the planar substrate and the carrier substrate form a membrane hosting the plurality of diffractive optics.

The nanolaminate may further comprise a smoothing layer between the sidewall of each column and the sequence of layers defining the specified diffractive line pattern around each column, the smoothing layer providing an rms surface roughness no greater than a fraction of a thinnest deposited layer of the nanolaminate.

In one embodiment of the device structure, the substrate material comprises crystalline silicon. Examples for a first material M1 comprise at least one of platinum; iridium; tungsten; rhodium; osmium; silicon oxide; zinc oxide; titanium oxide; tantalum oxide; hafnium oxide; and compounds, alloys and mixtures thereof. Examples for a second material M2 comprise at least one of boron nitride; carbon; boron carbide; silicon dioxide; silicon nitride; silicon carbonitride; aluminum oxide; and compounds and mixtures thereof.

Device structures comprising a plurality of diffractive optics as described herein may be fabricated by batch processing using a precursor substrate comprising an array of a plurality of columns, each column formed within a recess; depositing on the sidewall of each column the nanolaminate defining the annular diffractive lines of the specified diffractive line pattern; filling any remaining part of each recess with filler material, and performing front and back surface planarizations to expose first and second surfaces of the diffractive lines around each column and to thin the resulting structure to the required axial height h, thereby forming the array diffractive optics.

For example, in an embodiment, a method for fabrication, by batch-processing, of a device structure comprising a plurality of diffractive optics as described herein, comprises: providing a precursor structure comprising an array of columns formed within recesses etched into a planar substrate, each column having a sidewall of specified vertical and lateral dimensions and sidewall angle;
depositing on the sidewall of each column a nanolaminate comprising a sequence of alternating layers of different complex refractive index, the sequence of layers of the nanolaminate forming, around each column, annular diffractive lines defining a specified diffractive line pattern for a binary or higher order diffractive optic for photons or particle radiation of a prescribed energy;
providing a filler filling remaining surface voids;
performing a front surface planarization to expose first surfaces of each column, the diffractive line pattern around each column, and surrounding parts of the filler and substrate forming the forming the supporting frame;
performing a back side planarization to thin the substrate and expose second surfaces of each column, the diffractive line pattern around each column, and surrounding parts of the filler and substrate forming the supporting frame;
each column forming a core support for the nanolaminate defining the diffractive line pattern of one of the diffractive optics, wherein a height h of the diffractive line pattern between first and second surfaces in a direction of propagation provides a designed absorption difference and/or phase shift difference between adjacent diffractive lines of the diffractive line pattern.

For example, providing a precursor structure comprises providing a first substrate having a planar front surface and back surface, performing an anisotropic etch process comprising patterning of the front surface of the substrate and removal of material of the substrate to define the array of a plurality of columns within recesses.

The nanolaminate comprises at least first and second materials M1 and M2 having a respective first and second complex refractive index at the prescribed wavelength or energy, and said step of depositing the nanolaminate comprises depositing a layer sequence (M1, M2)$_1$, (M1, M2)$_2$ . . . (M1, M2)$_m$ defining diffractive lines of the specified diffractive line pattern around each column.

After providing a planarization layer or filler, performing front surface planarization and thinning of the substrate to expose first and second surfaces of the diffractive line patterns of each diffractive optic may comprise: performing a first planarization to remove parts of the planarization layer and the sequence of layers and exposing a planarized front-side surface comprising a first surface of each column, of the diffractive lines around each column and surrounding parts of the filler and the first substrate; attaching a carrier substrate to the planarized front-side surface; performing a second planarization to thin the backside of first substrate and remove part of the first substrate and the sequence of layers to provide a planarized back-side surface exposing a second surface of each column, of the diffractive lines around each column and surrounding parts of the filler and first substrate; and further comprising removing at least part of the carrier substrate to expose the first surface of the diffractive lines defining the specified diffractive line pattern around each column, thereby producing an array of a plurality of diffractive optics supported by remaining parts of the first substrate and the carrier substrate.

For example, for photons or particle radiation of the prescribed wavelength or energy, an axial height h between the first surface and second surface of each of the diffractive lines of each diffractive optic, in a direction of propagation, provides at least one of:
a required absorption difference between adjacent diffractive lines,
a phase shift difference of $\pi$ between adjacent diffractive lines, and
a phase shift difference of a designed fraction of $\pi$ between adjacent diffractive lines;
and wherein the aspect ratio of the axial height h and the layer thickness of a thinnest layer of the sequence of layers of the diffractive line pattern is greater than 10:1.

The depositing of at least thinner layers of the nanolaminate comprises Atomic Layer Deposition (ALD) or variations of spatial ALD or pulsed CVD.

The precursor forms may be structured to provide two-dimensional and one-dimensional (linear) diffractive optics. For example, for two-dimensional diffractive optics, the columns may comprise cylindrical columns, or tapered columns, or columns or pillars of other forms of circular or non-circular cross-section. For example, precursor structures of interest for zone plates for use as condensers to illuminate a field of view quasi-uniformly may comprise polygonal prismatic cross-section pillars, such as square-cross section and hexagonal cross-section pillars. Each column may be formed within a surrounding recess, such as a cylindrical hole or recess or a surrounding trench of another suitable shape. For one-dimensional, or linear, diffractive optics, the columns may comprise columns with a rectangular cross-section, e.g. forming linear mesas such as linear ridges, with vertical sidewalls or sidewalls with a selected sidewall angle, formed within trenches.

The step of smoothing sidewalls of the columns to provide the precursor forms having sidewalls with a predetermined surface roughness comprises, prior to depositing the sequence of layer of M1 and M2, providing a sidewall smoothing layer, the sidewall smoothing layer having an RMS surface roughness of a designed fraction of the thickness of the thinnest layer of the sequence of layers of M1 and M2 of the diffractive line pattern. Preferably, the RMS surface roughness of the smoothing layer is no greater than half of the thickness of the thinnest layer.

For example, providing a smoothing layer may comprise depositing a conformal layer of a reflowable material and heat treating the reflowable material to reduce surface roughness through capillary action. Providing a smoothing layer alternatively comprises depositing a first layer of a smoothing material having a thickness that is greater than the peak to peak surface roughness of the sidewall of the precursor form, and optionally heat treating or chemically treating the smoothing layer, to reduce surface roughness, for example, to provide an RMS surface roughness of ≤10 nm, or more preferably ≤1 nm, as suited for the thinnest diffraction line to be constructed upon the column.

In preferred embodiments, the step of depositing of at least thinner layers of the sequence of layers comprises Atomic Layer Deposition. Since ALD deposition works by flushing alternately a precursor gas or vapor and a reactive gas or vapor into the reactor chamber to allow for a monolayer or fraction of monolayer growth, the deposition thickness can be conveniently and accurately controlled by counting the number of flushing sequences. This method allows for an accurately controlled deposition to control the thickness of each layer of the sequence of M1, M2 layers, which may have thicknesses typically in the range from 0.1 nm to 100 nm thick or higher, as limited by reasonable deposition times. Optionally, the step of depositing may further comprise Chemical Vapor Deposition (CVD) for deposition, e.g. for depositing of at least some of the thicker layers of the sequence of layers.

The step of performing the first planarization may comprise any one of mechanical polishing, chemical polishing, chemical-mechanical polishing, ion beam polishing and a combination thereof.

In an embodiment, after performing the first planarization, the method further comprises attaching a carrier substrate to the planarized first surface of the first substrate; and then performing the second planarization for removing at least part of the first substrate (substrate thinning) to expose a second surface of each of the diffractive line patterns, thereby producing an array of a plurality of diffractive optics supported by remaining parts of the first substrate and the carrier substrate.

The step of performing the second planarization may comprise any one of grinding, mechanical polishing, chemical etching, chemical polishing, chemical-mechanical polishing, ion beam polishing and a combination thereof.

In an embodiment with a carrier substrate, removing at least part of the carrier substrate, to expose the first surface of each of the diffractive line patterns, comprises opening a plurality of windows in the carrier substrate aligned to each of the plurality of diffractive optics of the array or groups thereof.

Optionally, the carrier substrate is bonded to the planarized first surface with at least one intermediate layer, and removing at least part of the carrier substrate to expose the first surface of each of the diffractive line patterns comprises opening windows in the carrier substrate aligned to each diffractive optic to expose said intermediate layer. The at least one intermediate layer may be removed, or it may form part of a membrane support for each diffractive optic.

The method may further comprise providing one or a plurality of additional layers on one or both of the front and back sides (i.e. first and second surfaces) of each diffractive optic, comprising any one of: providing one or more support layers or stress reduction layers for improved mechanical properties; providing one or more thermal dissipation layers; providing one or more electrically conductive layers; providing a separation layer for constructing other planar optical devices atop of the diffractive device; and a combination thereof.

The method optionally comprises post-processing by any one of ion implantation, etching or heat treatment for at least one of: reshaping, trimming, stress engineering, adjusting functionality and fine tuning of optical properties of the diffractive optics. Optional post-processing for integration of other X-ray micro-optics with other or complementary functionalities is possible. For instance, the filler material can be a heavy metal, with high X-ray absorption. For example, this metal can provide a field aperture or part of a field aperture.

The first substrate comprises, for example, a large diameter silicon wafer, which is polished on at least the front side, and which enables for fabrication of an array of a large plurality of diffractive optics by standard batch processing of a set of wafers, e.g. to form tens or hundreds of diffractive optics elements on each wafer. After completion of the above mentioned fabrication steps, the method further comprises a step of device singulation, e.g. wafer dicing or cleaving, to form individual device structures (chips) comprising one or more diffractive optics on each chip.

Fabrication of the high aspect ratio diffractive optics on a standard silicon wafer, by adaptation of conventional semiconductor processing technologies, is compatible with further processing for integration of other optical and electronic components on the same substrate for more complex functionalities.

When the diffractive line pattern comprises a nanolaminate of a sequence of layer pairs of first and second materials M1 and M2, by way of example, the first material M1 comprises: at least one of platinum, iridium, tungsten, rhodium, osmium, tantalum oxide, zinc oxide, titanium oxide, hafnium oxide, and compounds, alloys or mixtures thereof; and the second material M2 comprises: at least one of boron nitride, carbon, boron carbide, silicon carbide, silicon carbonitride, silicon dioxide, silicon nitride, aluminum oxide, and compounds, or mixtures thereof. The alternating layers of M1 and M2 form a binary diffractive optic.

In some embodiments the sequence of layers comprises a nanolaminate of a sequence of m layer stacks, wherein each layer stack comprises N layers of materials M1, M2, ... MN, where N is ≥3, the materials M1, M2, ... MN having an ordered sequence of different complex indexes of refraction at the prescribed wavelength or energy, the sequence of layers being deposited to form the sequence of m layer stacks (M1, M2, ... MN)$_1$, (M1, M2, ... MN)$_2$, (M1, M2, ... MN)$_m$ with specified layer thicknesses to define an Nth order diffractive optic.

By appropriate selection of the diffractive line pattern, the materials M1 ... MN, and dimensions of the diffractive optics, high aspect ratio, one or two dimensional diffractive optics can more readily be fabricated for focusing or shaping of wavefronts of x-ray or gamma-ray electromagnetic radiation having a prescribed wavelength energy in the range from ~1 keV to hundreds of keV. The present method is particularly applicable for high aspect ratio diffractive optics for energies in the range above 5 keV, e.g. 8 keV to 100 keV or more. At lower energies, where a high thickness of the absorber/phase shifter materials is not required, other known methods of fabrication may be applicable, but the methods disclosed herein still offer the advantage of an easy way to obtain fine zones in the sub-20 nm zone widths domain. For higher energies, embodiments of the methods disclosed herein are particularly applicable to provide for batch fabrication of high aspect ratio and ultra-high aspect ratio diffractive optics for photons or particle beams of higher energies corresponding to hard x-rays or gamma rays, e.g. several hundred keV.

By way of example, to provide high aspect ratio two dimensional diffractive optics structures, defining the precursor structure wherein each column comprises a cylindrical column; and wherein each cylindrical column comprises: a diameter in the range from a few micrometers to a few hundreds of micrometers, sized to form a core for the sequence of layers defining the diffractive zone pattern; a side wall angle not more than 5 degrees from vertical, and preferably within 0.5 degrees of vertical; a height between 1 µm and 200 µm, such that after planarization, resulting diffractive optic has the axial height h, the thickness of the thinnest layer of the sequence layers is between 0.2 and 100 nm; and wherein the aspect ratio of said axial height h to said thickness of the thinnest layer is between 20:1 and 100,000:1.

Preferably each precursor column is formed within a surrounding recess, such as a cylindrical hole, and each recess is surrounded by a reinforcing region of the substrate, e.g. each recess is appropriately spaced from neighboring recesses by an intervening region of the substrate, to provide robustness during polishing, planarization or other fabrication processes. The spacing between sidewalls of the recess or hole and the sidewalls of the column facilitates measurement of the precursor after their fabrication in terms of size, sidewall slope, and surface roughness. The recess also provides that each column is spaced from and surrounded by a surface region of the first substrate (i.e., a reinforcing region) to act as a robust etch stop and facilitate subsequent polishing steps. The recess is sized to contain the sequence of layers of the nanolaminate defining the specified diffractive line pattern on the sidewall of the column, including any smoothing layers. Since the deposited layer sequence defining the diffractive lines on the sidewall of each column also forms layers on the surrounding sidewall of the recess, the recess is sized to accommodate twice the total thickness of the layer sequence of the nanolaminate and a required thickness of filler material. The columns may have substantially vertical sidewalls, e.g. side wall angle of not more than 0.5 degrees, or may have a specified side wall angle, e.g. 5 degrees or other specified angle, or a calculated/targeted shape with varying tilts within −0.5 and +0.5 degrees from a central/average value. A large number of precursor forms can readily be defined in first substrate comprising a silicon wafer, using a sequence of conventional fabrication steps such as reactive ion etching.

In another embodiment, for fabricating linear diffractive optics, wherein the precursor structure comprises an array of columns wherein each column has a rectangular cross-section, e.g. to form linear mesas, such as a linear ridge, formed within a linear trench, each linear ridge comprises: a width in the range from few micrometers to hundreds of micrometers and length from tens of micrometers to a few millimeters, sized to form a core for the sequence of layers defining the diffractive line patterns; a height between 1 µm and 200 µm, such that after planarization, the resulting diffractive optics have the required axial height h; the thickness of last deposited (thinnest) layers of the sequence layers is between 0.2 and 100 nm; and wherein the aspect ratio of said axial height h to said thickness of the thinnest deposited layers is between 20:1 and 100,000:1.

Preferably each ridge is formed within a surrounding trench. Each ridge may have substantially vertical sidewalls, e.g. a sidewall angle of not more than 0.5 degrees. In some embodiments, each ridge has a sidewall angle along its length not greater than 5 degrees from vertical. Alternatively, for some applications, a greater sidewall angle is required, and each ridge has tapered sidewalls, having a predefined sidewall angle α with respect to the wafer plane, along its length.

In summary, methods according to embodiments of the present invention overcome at least some limitations of conventional ALD-and-slice methods, which are based on sequential atomic layer deposition method on wires and inside capillaries. In particular, the disclosed methods provide for a batch process executable at wafer scale. Batch processing is achieved by providing precursor structures, i.e. forms or patterns, etched into a planar substrate, such as a large diameter silicon wafer, and processing a batch of a large plurality of diffractive optic structures by the wafer, and/or several wafers at a time ("wafer batch") up to singulation. A sequence of method steps is used to create a precursor structure comprising an array of a plurality of precursor forms such as columns within recesses, and linear mesas within trenches. After sidewall smoothing, the precursor structures are sequentially coated with a nanolaminate comprising a sequence of ALD layers, M1 . . . MN, of controlled thicknesses defining diffractive layers or zones, to create an array of a large number of diffractive optics on each wafer. Conventional slicing of individual wires or capillaries is replaced by wafer thinning and planarization techniques, such as chemical mechanical polishing, followed by device singulation, e.g. by dicing or cleaving, to produce a batch of large number of individual device structures e.g. fabricated as membranes carrying one or more diffractive optics.

For example, a method of an embodiment for fabricating Fresnel zone plates disclosed herein overcomes at least some disadvantages of the conventional ALD-and-slice method, by replacing wires or hollow tubes with arrays of a plurality of precursor forms, e.g. cylindrical columns within surrounding cylindrical holes or recesses, etched in a planar substrate, such as a silicon wafer. Using cylindrical columns to deposit the sequential layers around them has the advantage of enabling a better characterization of the side wall roughness and tilt of the columns versus methods using cylindrical holes. Using cylindrical columns within concentric cylindrical holes or recesses provides a surrounding region of the substrate which confers robustness to the column structures for withstanding mechanical polishing. Formation of precursor structures and deposition of sequential layers by ALD is followed by standard batch-processing methods, to replace the conventional tedious serial slicing and individual wire polishing processes with mature and rapid wafer-level processing. This approach allows for parallel processing of hundreds of devices at a time at the wafer level, with processes common through-out the electronics and MEMS industry. The limitations of the disclosed process reside primarily in the accuracy of producing the initial precursor structures (e.g. arrays of cylindrical columns within cylindrical recesses, and arrays of linear mesas within trenches, and other precursor forms or precursor structures disclosed herein) and in controlling the thicknesses in the sequenced layer deposition, practically, in the 1 nm to 100 nm range. The innovative process sequence allows for device thicknesses limited in practice primarily by the fabrication process height limits of columns in semiconductor substrates, which are typically in the range from a fraction of a µm to hundreds of µm. This translates into potential aspect ratios for the resulting zone plate lines of up to tens of thousands or even hundreds of thousands to one. This approach is not limited to precursors comprising columns of circular cross-section, since conventional lithography and etching processes, e.g. as used for Si process technologies, can be used to define columns having other cross-sectional shapes, and columns in the form of linear mesas, with accurately defined geometries for two-dimensional diffractive optics and one-dimensional (linear) diffractive optics.

For example, the focussing efficiency of the resulting diffractive optic comprising a zone plate depends on factors including the aspect ratio, the amount of phase shift, which is preferably π, or close to π, provided between adjacent zones, and the quality of the execution of the zone plate structure. Smoothing of sidewalls of the precursor forms prior to deposition of the sequence of layers of the diffractive line pattern improves the quality of execution of the diffractive line patterns. That is, since any initial roughness or non-uniformity of surfaces of the precursor forms are propagated in successively deposited layers, smoothing of surfaces of the precursor form allows for closer control of the thickness and uniformity of the deposited sequence of layers forming the specified diffractive line pattern of the zone plate.

The disclosed methods and device structures are particularly applicable to diffractive optics, such as a high resolution Fresnel Zone Plate of ultra-high aspect ratio (up to tens of thousands to one) for focusing of hard X-rays or gamma-rays with energies up to hundreds of keV, with zone widths down to few nanometers or less, and thicknesses of a few to tens of micrometers. Fabrication on a semiconductor substrate, such as a silicon wafer, enables integration or mounting of other optical and electrical components on the same substrate.

Optional post-processing is possible and can lead to enhancement of the mechanical, thermal, and electrical properties of the devices, or can be used to fine tune their optical properties. The method can be readily generalized for nanolaminates comprising multilayer stacks of ALD films, M1, M2 . . . MN, to approach a smooth variation of absorbance and of phase shifting across Fresnel zones, for an increase in efficiency and the elimination of unwanted focusing and diffraction orders. Optional post processing for integrating other X-ray optical components or integrating the X-ray optics into more complex micro-electro-mechanical systems is possible.

The foregoing, and other objects, features, aspects and advantages of the present invention will become more apparent from the following detailed description, taken in conjunction with the accompanying drawings of embodiments of the invention, which description is by way of example only.

BRIEF DESCRIPTION OF THE DRAWINGS

FIG. 15A shows a schematic cross-sectional view of an three-phase diffractive optics device of a third embodiment, comprising a FZP for hard X-rays, using a three layer stack of materials M1, M2, and M3; FIG. 15B shows a resulting 3-step phase shifts approximation of an ideal continuous-varying phase shift in a kinoform, as shown in FIG. 15C;

FIG. 16A shows a schematic cross-sectional view of a multiple-phase diffractive optics device of a fourth embodiment, comprising a FZP for hard X-rays, using multiple layers (N) stacks of materials M1, M2, . . . MN; and FIG.

16B illustrates the resulting N-steps phase shift approximation of an ideal continuous-varying phase shift in a kinoform, as shown in FIG. 16C.

Figure 17:
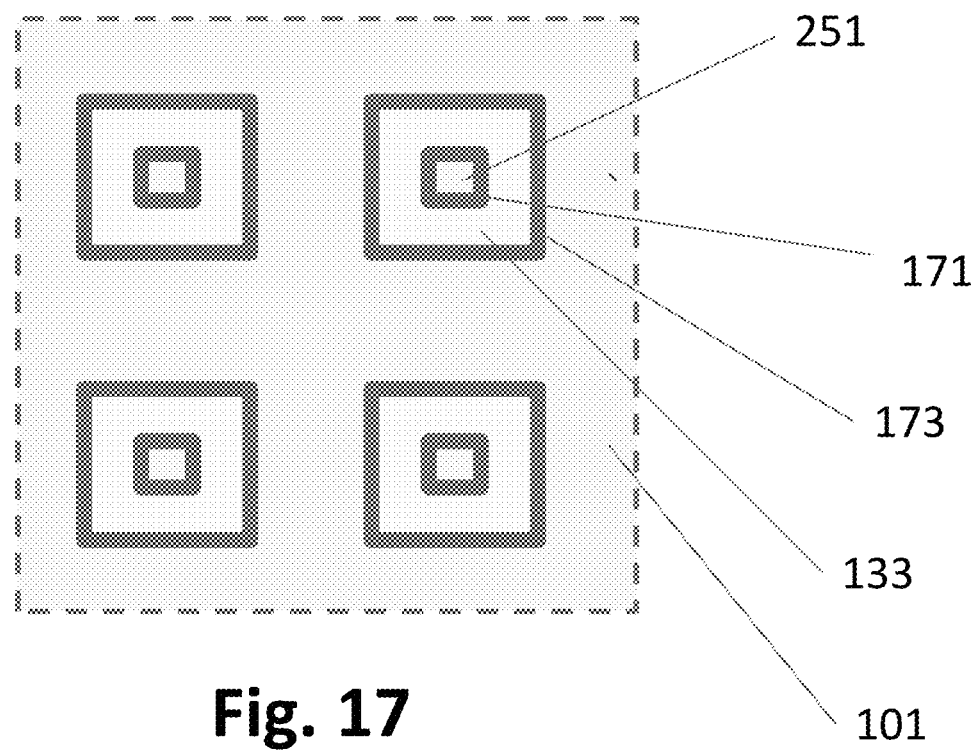
Figure 18:
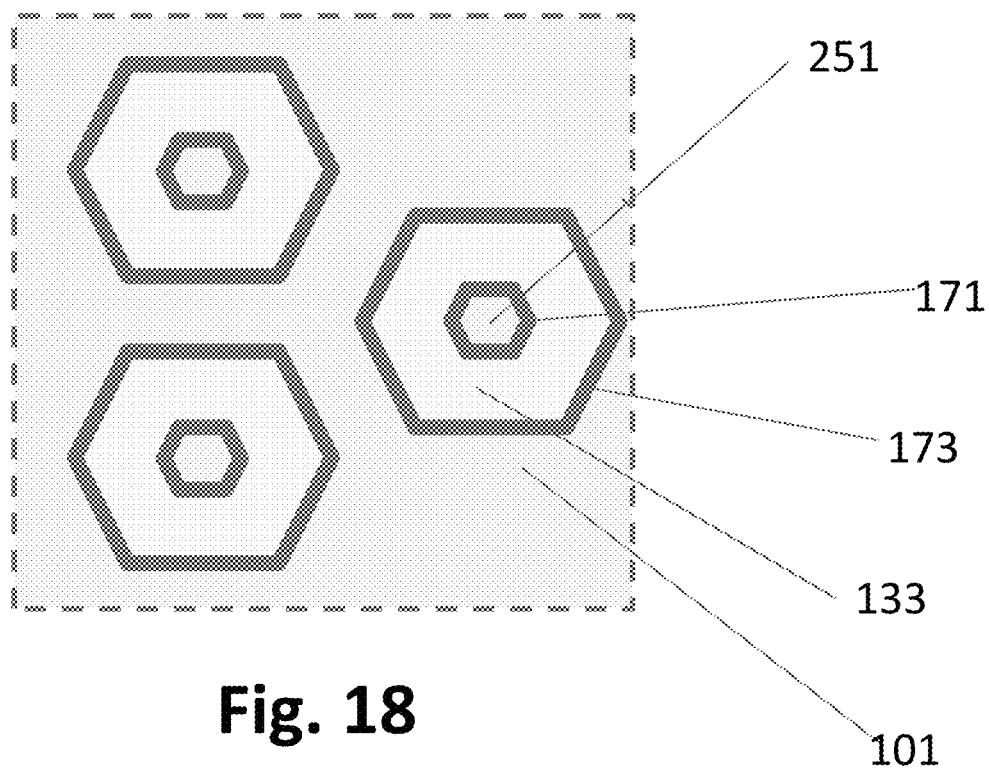
Figure 19:
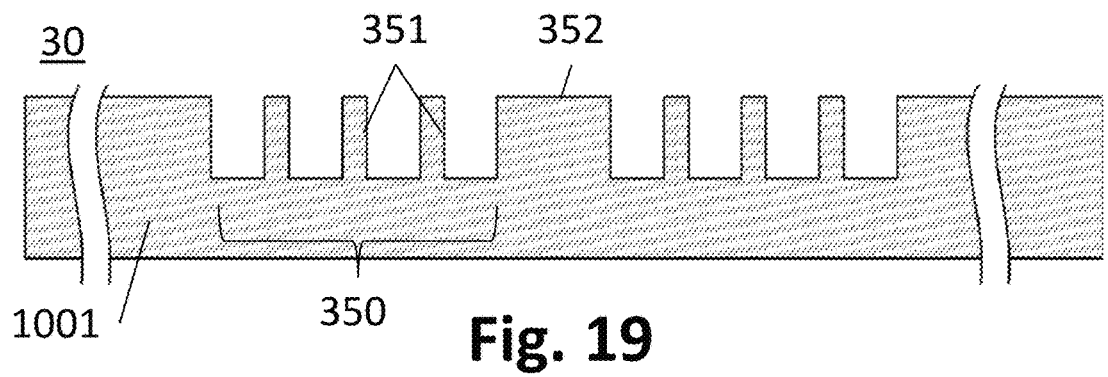
Figure 20:
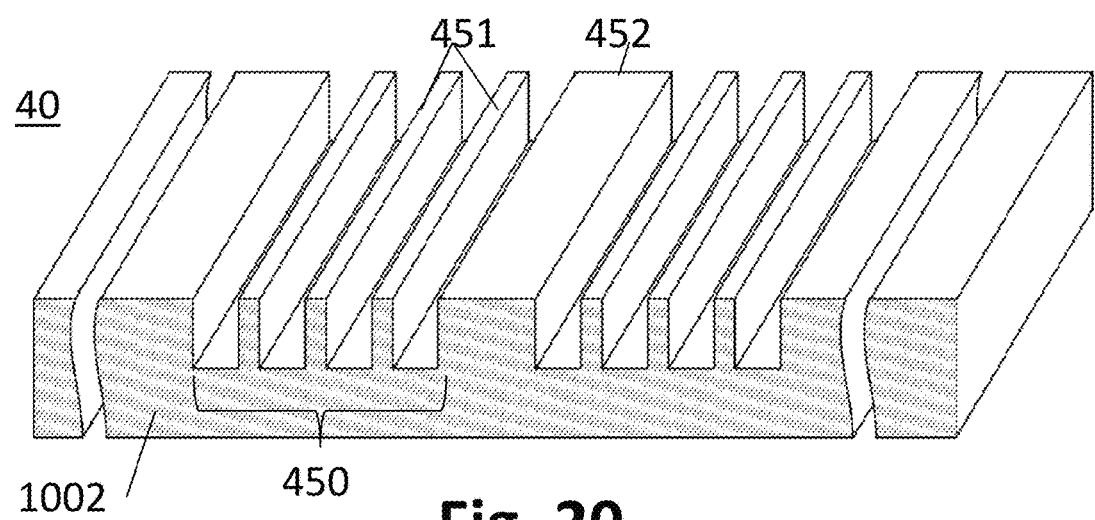
Figure 21:
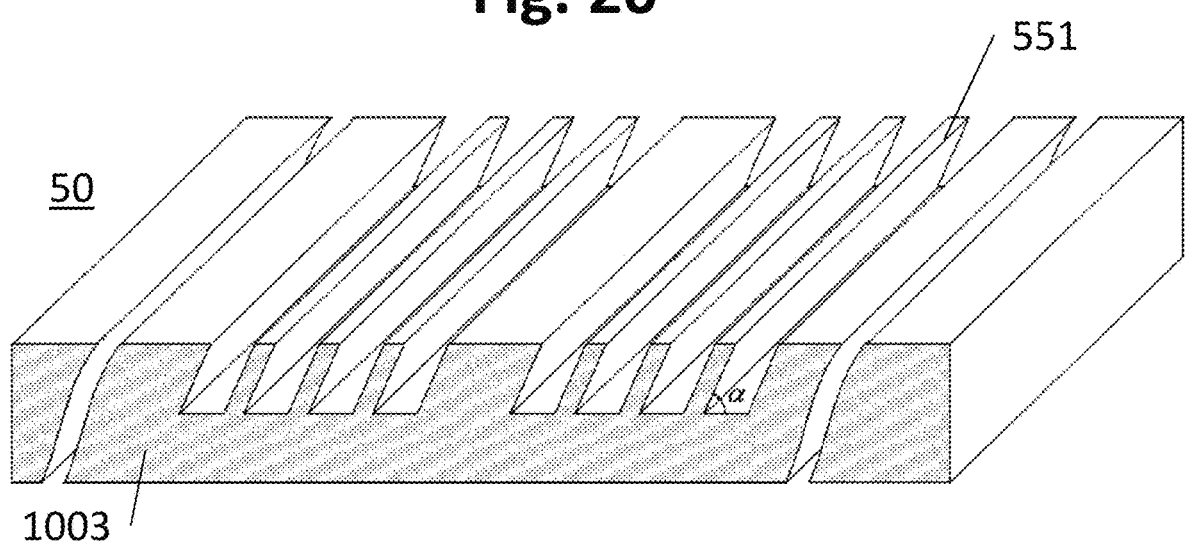
Figure 22:
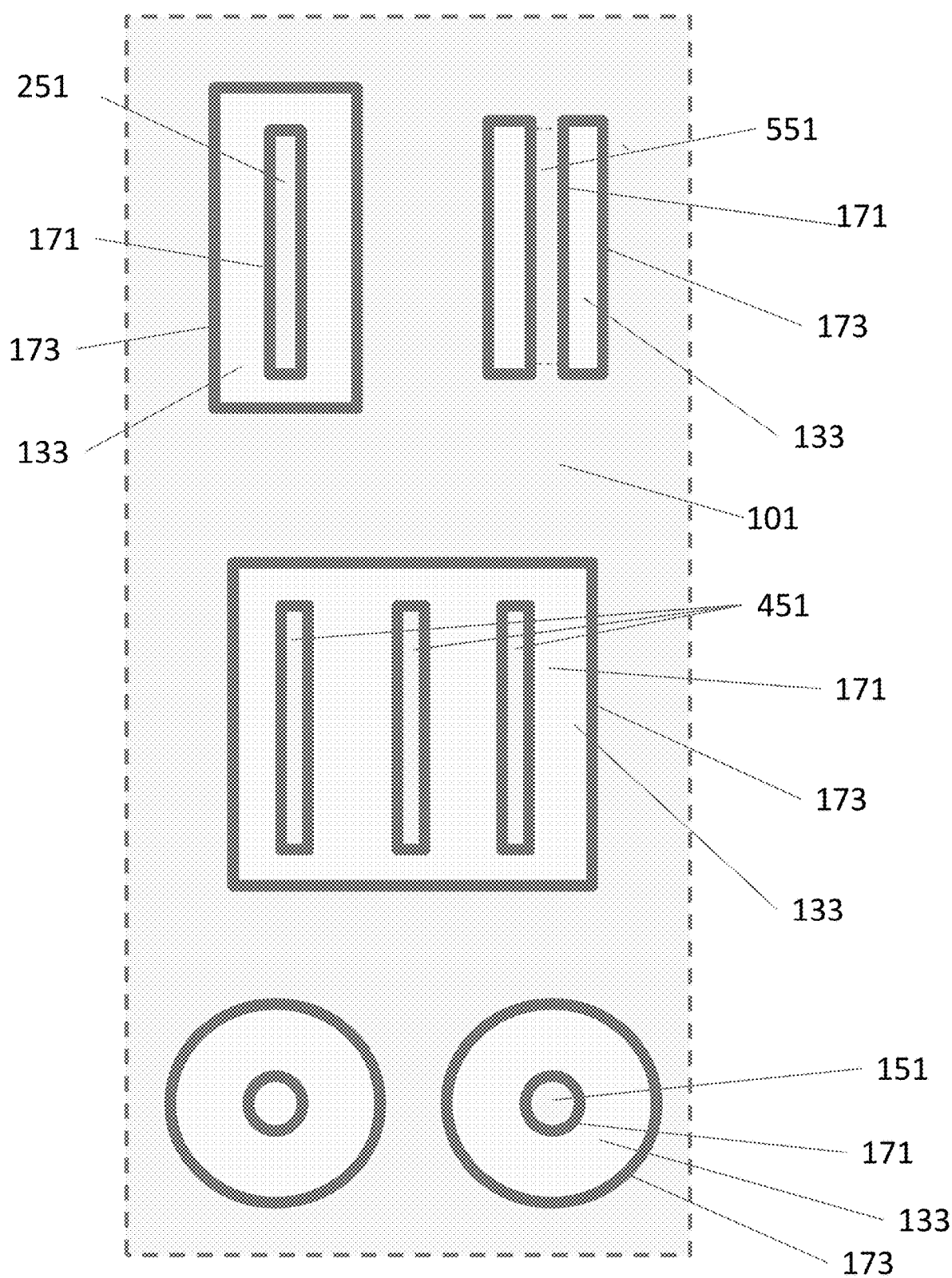

FIG. 17 shows a schematic view of part of a device structure comprising part of an array of diffractive optics comprising four diffractive optics supported by a membrane comprising the surrounding substrate, wherein columns 151 of the precursor structure have the form of square pillars;

FIG. 18 shows a schematic view of part of a device structure comprising part of an array of diffractive optics comprising four diffractive optics supported by a membrane comprising the surrounding substrate wherein columns 151 of the precursor structure have the form of hexagonal pillars;

FIG. 19 shows part of a device structure according to an embodiment comprising a planar substrate wherein the precursor form comprises an array of a plurality of recesses wherein a group of a plurality of columns is defined within each recess;

FIG. 20 shows part of a device structure according to an embodiment comprising a planar substrate wherein the precursor form comprises an array of linear mesas, in the form of linear rectangular ridges defined within linear trenches; and FIG. 21 shows part of a device structure according to an embodiment comprising a planar substrate wherein the precursor form comprises an array of linear mesas in the form of trapezoidal shaped ridges within trenches, having a sidewall angle α relative to the wafer plane;

FIG. 22 shows a schematic view of part of a device structure of an embodiment wherein the precursor structure comprises a combination of different forms including a plurality of linear mesas (ridges) defined within linear trenches and cylindrical columns defined within cylindrical recesses; and FIG. 23 shows a table (Table 1) of parameters, comprising photon or particle energy, index of refraction, zone height h and aspect ratio, for some examples of materials M1 and M2.

DETAILED DESCRIPTION OF EMBODIMENTS

FIGS. 1 to 10 illustrate schematically steps in a batch processing method of fabricating a device structure comprising a high aspect ratio diffractive optic according to a first embodiment, comprising a Fresnel Zone Plate (FZP).

Figure 1:
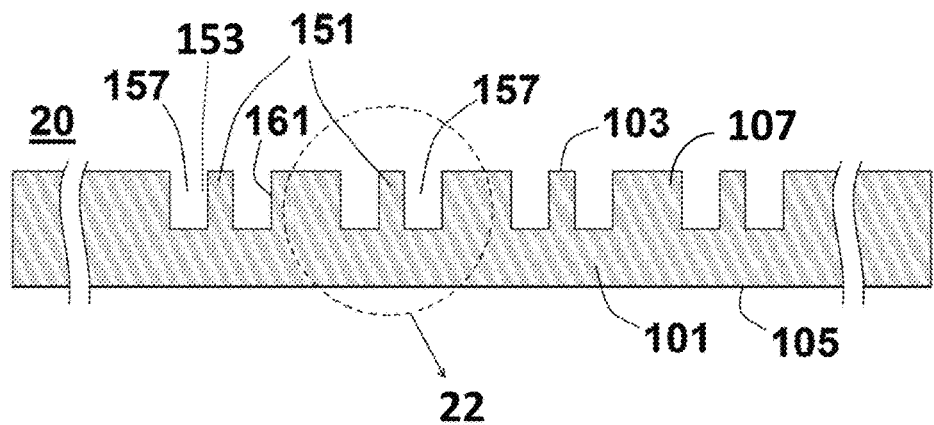
FIG. 1 shows a schematic vertical cross-sectional view through part of a device structure of a first embodiment, wherein the precursor structure comprises an array of cylindrical columns 151 within recesses 157 etched in a substrate 101.
Figure 2:
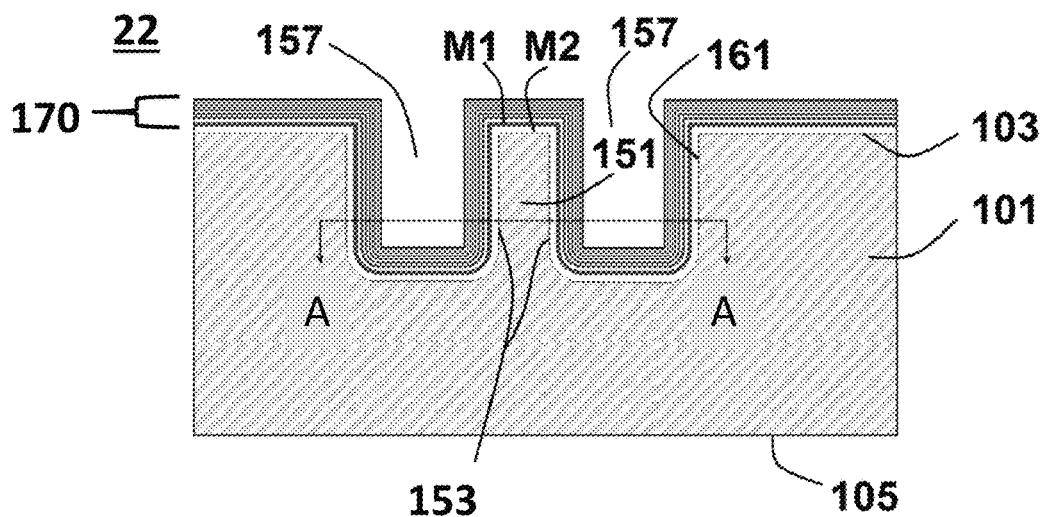
FIG. 2 shows an enlarged view of part of FIG. 1 after sequential deposition of a nanolaminate 170 comprising a sequence of alternating material layers M1 and M2 defining zones of an FZP around each column 151.

FIG. 1 shows a schematic cross-sectional view part of a precursor structure 20 comprising an array of cylindrical columns 151 defined in a planar substrate 101. Each column 151 is formed within a surrounding, concentric, cylindrical recess 157, with the sidewall 161 of the recess spaced from the sidewall 153 of the column. The planar substrate comprises, for example a silicon wafer having a smooth polished planar front surface 103 and back surface 105. FIG. 2 shows an enlarged view of part 22 of FIG. 1, comprising one of the array of cylindrical columns 151 within its recess 157, after deposition of a nanolaminate 170 comprising a sequence of conformal layers, comprising a first material M1 and a second material M2. As illustrated schematically, the nanolaminate 170 comprises a sequence of alternating layers of M1 and M2. The electromagnetic properties of each of first and second materials M1 and M2, e.g. refractive index and/or absorption, and the thickness of each layer are selected to form diffractive zones a FZP for electromagnetic radiation or particle beams of a predetermined energy, e.g. for X-rays.

Figure 3:
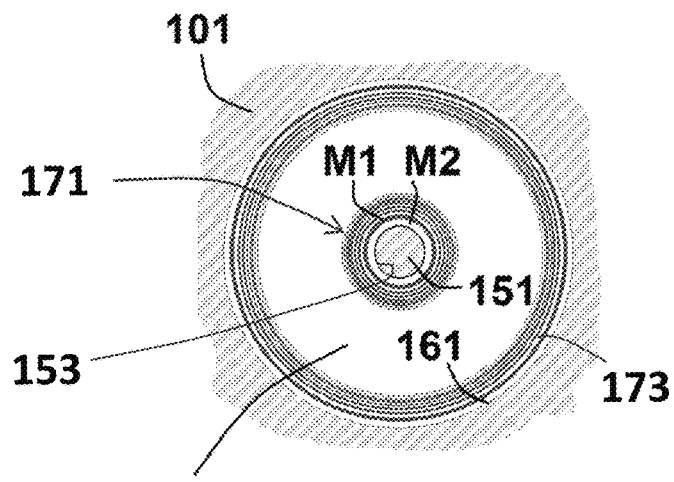
FIG. 3 shows a schematic transverse (horizontal) cross-sectional view through plane A-A of the device structure of FIG. 1 to show a part of the nanolaminate 171 comprising the FZP zone structure of alternating layers M1 and M2, visible as concentric circles (zones) forming a binary diffractive optics device around the central column 151.

Thus, in transverse cross-section through plane A-A of FIG. 2, as illustrated schematically in FIG. 3, the resulting device structure comprises part of the nanolaminate 171 formed on the sidewall 153 of the column 151. The nanolaminate 171 forms a series of concentric rings of alternating layers M1 and M2 defining the diffractive zones, which collectively form a specified diffractive line pattern of the FZP, surrounding the sidewall 153 of the column 151, within the recess 157. Thus, each column 151 forms a core support for the diffractive line pattern 171 of the diffractive optic. As shown schematically, another part 173 the nanolaminate is also deposited on the sidewall 161 of the recess, but does not form part of the diffractive line pattern of the FZP. The nanolaminate does not entirely fill the recess 157 around the column 151, leaving a surrounding void or gap.

For simplicity, only one cylindrical column 151 is shown in FIGS. 2 and 3. More generally, for batch-processing, the substrate comprises a wafer or disc of a suitable substrate material, for example a crystalline silicon wafer, and an array of a plurality of cylindrical columns 151 are defined in the substrate, as illustrated schematically in FIG. 1. That is, the cylindrical columns 151 are defined by removing substrate material to form the recesses 157, using a suitable anisotropic etch process which is capable of forming columns 151 of the required dimensions and tolerances, e.g. depth, diameter, aspect ratio, and sidewall tilt angle or slope. The sequence of layers M1 and M2 of the nanolaminate is deposited by a suitable isotropic deposition method, preferably atomic layer deposition (ALD), which is capable of providing the necessary tolerances for material characteristics, uniformity, and thicknesses of each layer of M1 and M2. Chemical Vapor Deposition may alternatively be used for some of the thicker layers.

As illustrated schematically in FIGS. 2 and 3, the layer thicknesses of M1 and M2 decrease outwardly from first deposited (thickest) layer on the sidewall of the column towards the last deposited (thinnest) layer of the nanolaminate 171 defining the diffractive zones of the FZP. Each column 151 forms a non-diffractive core supporting the surrounding structure.

Since the thinnest (last) deposited layers may be only a few nm thick, ALD is used for depositing the thinner layers with the required thickness and accuracy. ALD provides for controlled deposition of thin conformal layers, with atomically specified thicknesses, at deposition rates in the range of 10-300 nm/hr, or sub-Angstrom per ALD flushing cycle, for example. Thus, layer thickness may be finely controlled by counting the flushing cycles of the ALD process or by timed deposition cycles for each layer. For faster, lower cost processing, CVD may be used for depositing the thicker inner layers.

The cylindrical columns can be produced using any suitable etching methods well known by those skilled in the art, e.g. by various types of reactive ion etching (RIE), ion beam etching, or metal assisted etching. The requirements for the shape and dimension of the columns and surrounding recesses, including height/depth, diameter, side wall tilt (angle) and roughness of the columns, for this diffractive optics application are well within the ranges permitted by known processes, e.g. RIE etch processes well-known in silicon processing technology for electronics devices, focused ion beam milling (FIB), cryo-etching by inductive-coupled plasma RIE, metal assisted etching of Si (Z. Huang, Adv. Mater. 2011, 23, 285-308) starting from arrays of gold toroids and using a $HF-H_2O_2$-DI water solution, or enhancements of this method using ferromagnetic layers sandwiched between noble metal bottom and top capping and a strong magnetic field (Y. Oh, Nano Lett. 2012, 12, 2045-2050) to guide the hole formation), or any other known method. These examples are listed by way of example only. Beneficially, the array of precursor forms is formed on a low cost planar substrate, such as a large diameter silicon wafer, which allows for batch-processing of arrays of a large number of diffractive optics.

Some etching methods for removing substrate material from the recesses to define columns of the required dimensions are known to leave surfaces with roughness in the tens of nm range. Certain deep reactive ion etch (DRIE) processes, such as the standard Bosch process for forming structures in silicon, e.g. deep, high aspect-ratio holes and other structures with steep sidewalls, are known to form ripples or "scalloping" on the side walls. The sidewall ripples may be as large as ~100 nm. Any surface roughness, surface defects, or non-uniformities of the sidewalls of the cylindrical columns are propagated through the successive layers M1 and M2 of the FZP. The thinnest zones of the FZP may be less than 20 nm thick, and perhaps ≤5 nm thick, or ≤1 nm. Thus, in practice, a wall-smoothing procedure is used to reduce the size of the ripples or "scallops", or other surface roughness resulting from the etch process, and to smooth the sidewalls of the columns to reduce surface roughness to an acceptable amount before ALD of the nanolaminate layer sequence of M1 and M2 forming the zones of the FZP.

The wall-smoothing method can comprise, for example, a chemical wet etch, deposition and annealing of a low temperature melting or softening material such as boron-phosphorus silicon glass (BPSG), phosphorus silicon glass (PSG) or a polymer, deposited at a thickness comparable to, or slightly larger than, the peak-to-peak roughness of the side-walls of the initial structure. For example, for applications such as MEMs fabrication, side wall smoothing and scallops reduction via etching are described by K. Yu and A. Kumar in (US201400574146 A1), and use of annealed oxides is described by K.-Y. Weng et al. (NSTI-Nanotech 2004, www.nsti.org, ISBN 0-9728422-7-6 Vol. 1, 2004).

For fabrication of diffractive optics devices as described herein, the choice of materials for a sidewall smoothing layer has to be such that their softening or melting temperatures are higher than the ALD process temperatures for deposition of the nanolaminate defining the diffractive line pattern of the diffractive optic. For a conventional FZP, the slope of the sidewalls of the cylindrical columns should be as close as possible to 90% i.e. substantially vertical, but deviations of +/−1° for even higher can be necessary to comply with the Bragg diffraction criteria, as proven necessary for high efficiency in high aspect ratio zone plates (e.g. J. Maser, G. Schmahl, Opt. Comm. 89, 1992, pp. 355-362). Typical values of sidewall angle are in the +/−0.5° range. The diameter of the cylindrical columns, after sidewall smoothing, should be targeted to match the inner diameter of the innermost (thickest) zone of the FZP or diffractive optics device design targeted for fabrication. For some device structures, as discussed below with reference to alternative embodiments, a larger sidewall angle may be sought after for blazing properties of the diffractive optics, depending on their targeted application. Since the width of the outermost (thinnest) zone is typically ~20 nm or less, ideally, the smoothing layer should reduce the surface roughness of sidewalls of the column to a required RMS surface roughness of ~10 nm and preferably 5 nm or less, typically a fraction, of the thickness of the thinnest diffractive zone, e.g. half of the thickness of the thinnest deposited layer of M1 or M2.

Once the precursor structure comprising the array of columns within recesses, e.g. cylindrical columns within surrounding cylindrical holes, is formed according to the desired or targeted dimensions for the diffractive optics devices, and after providing a smoothing layer, sequential ALD depositions are carried out to provide the layer sequence of pairs of materials M1 and M2, starting with the thickest zones first. Material M1 should be a material with high absorption or high phase shifting properties at the targeted or prescribed photon or particle energy that will be focused or wave-front manipulated by the diffractive optics devices. As is well-known in X-ray physics, high absorption or high phase shifting is represented by high values of $\beta$ or $\delta$, where $\beta$ and $\delta$ are the components of the complex refractive index (or complex index of refraction) expressed as $n=1-\delta-i\beta$. Suitable materials include, for example W, Ir, or Pt. Other materials are also possible, e.g. Au, or other heavy metals or their compounds, mixtures or alloys, heavy metal oxides or nitrides or other compounds, as long as a suitable ALD process or other isotropic deposition process with stringent thickness control is available for deposition of the layers. The thickness control of the thinnest layer/zone, or the thinnest layers/zones, is a critical and limiting factor for the resolution of the targeted FZP or diffractive optics device. If necessary, to reduce the process time required for the fabrication of the devices, less stringent thickness control deposition processes such as CVD or PECVD (Plasma Enhanced CVD) can be used for the first deposited thicker layers/zones.

To control the thickness and decide on which width for the innermost (first) layer/zone to start with, it is necessary to accurately know the diameter of the column, as well as to thoroughly characterize the ALD process, especially in the less linear onset regime, to determine the thickness variance characteristic of the layer(s)/zone(s) in question. It is known that less linear growth regimes occur during the first 1-5 ALD cycles, with each ALD cycle depositing about 0.08-0.1 nm of material. Therefore, control of thicknesses in the range of 0.5-1 nm is usually possible. The method also applies to the case of sub-monolayers of materials which may become controllable and reproducible in thickness, with the progress of ALD or other high performance material deposition technology.

After the first layer of material M1 is deposited, the same ALD reactor can and should be used to deposit the first layer of material M2. The order of depositing first M1 and then M2 can optionally be reversed. M2 should be a material with transmission and phase shifting properties (i.e. complex refractive index represented by $\beta$ and $\delta$) at the target photon or particle energy greatly distinct from material M1, and with deposition properties (especially temperature) as close as possible to material M1, to minimize transition periods in switching between ALD deposition cycles. Typical materials with low absorption ($\beta$) and low $\delta$ are BN (boron nitride), carbon-based materials such as polymers, $Al_2O_3$, and others as known by those skilled in the art. Since the difference in absorption/phase shifting is important in determining the focusing properties of the FZP or diffractive optics device, pairs of M1 and M2 materials can be chosen even for lower differences in phase shifting properties, provided that the thickness of the FZP and the initial column height is calculated to provide sufficient absorption difference and/or a phase shift of $\pi$ or sufficiently close to $\pi$, for the functionality of the diffractive optic.

As an example of choosing the material pairs M1 and M2 for the sequential deposition, the cases of boron nitride (BN) for material M2 and W, Ir, or Pt for material M1 are described in more detail. One important detail is that all these materials have well-known ALD deposition processes, for example, as described by J. D. Ferguson et al. for BN (J. D. Ferguson et al., Thin Solid Films 413 (2002) 16-25); J. W. Elam et al. for W (J. W. Elam et al., Thin Solid Films 386 2001 41-52); T. Aaltonen et al. for Ir (T. Aaltonen et al., J. Electrochem. Soc. 2004, Vol 1, 8, pp. G489-G492); and S. J. Ding et al. for Pt (S.-J. Ding et al., Nanoscale Research Lett., 2013, 8:80). Moreover, the deposition temperature ranges are overlapping, which allows choosing a common deposition temperature for M1 and M2, such that heating/cooling times in the reactor are avoided. Deposition cycles for the precursors of these materials are in the few seconds to few tens of second range, which allows for reasonably fast deposition processes. The cylindrical column should have a height such that, after completing fabrication, a straight and nearly vertical portion of its height provides for formation of a diffractive optic having a height h in a direction of propagation, where $\pi$ should be such as to produce a phase difference of $\pi$ between the X-rays passing through the layers of M1 and M2 at the prescribed photon or particle energy, or sufficiently close to $\pi$ or as designed. The complex refractive index of X-rays can be expressed as $n=1-\delta-i\beta$, where $\delta$ and $\beta$ have values in the $10^{-5}$-$10^{-10}$ range and depend on the photon energy. Optical path differences between rays passing through the high-$\delta$ value (in absolute value) materials (M1) and low $\delta$ value materials (M2) are represented by $\Delta=(1-\delta_{M1})h-(1-\delta_{M2})h=(\delta_{M2}-\delta_{M1})h$, where $\delta_{M1}$ and $\delta_{M2}$ are the values of $\delta$ for the two materials at the prescribed photon energy. For a phase difference of $\pi$, the optical path difference has to be $\lambda/2$, where $\lambda$ is the wavelength of the X-rays of the prescribed photon energy. This condition is represented by $\Delta=\lambda/2$, which means $(\delta_{M2}-\delta_{M1})h_\pi=\lambda/2$, where by $h_\pi$ is designated as the height of the zones giving a phase difference of $\pi$. Here from one can express the value of $h_\pi$ as $h_\pi=\lambda/2(\delta_{M2}-\delta_{M1})$.

Table 1 (FIG. 23) provides typical values of $\delta_{M1}$, $\delta_{M2}$, $h_\pi$ for photon energies of 10 keV, 30 keV, 50 keV, 100 keV and 200 keV, and the values of $h_\pi$ for the cases of pairing BN (as M2) with W, Ir or Pt (as M1). As is evident, the values of $h_\pi$ lay in the 2-40 μm range, which is readily achievable with current integrated circuit or MEMS process technology. Assuming a minimum zone width of 5 nm, which again is achievable with current ALD technology, the aspect ratios $A_{\pi\ W-BN}$, $A_{\pi\ Ir-BN}$, and $A_{\pi\ Pt-BN}$, can be calculated as presented in the last three columns of Table 1 (FIG. 23). As is evident, the values are between 400:1 and 8000:1 even for the most extreme energies shown, i.e. 200 keV which corresponds to a photon energy in the gamma-ray range. With thinner minimum ALD layers and taller columns, even higher aspect ratios are possible, which represent even more energetic gamma ray photons and corresponding particle energies.

The sequence of depositions of ALD layers of material M1 and M2 is repeated, with decreasing deposition times for successive layers, to account for the variation in the zone widths (i.e. deposited layer thickness) with zone number to form the specified diffractive line pattern of the FZP. Referring back to FIGS. 2 and 3, FIG. 2 shows a vertical cross-section through the ALD layers of the zone plate structure deposited according to the first embodiment, and FIG. 3 shows a transverse cross-section through such a FZP structure. Since the zones in this embodiment decrease outwardly in thickness, the ALD process will require fewer numbers of cycles for the deposition of each successive material layer. Limitations on the number of M1/M2 sequences deposited can arise from limitations of the ALD equipment, such as operating costs, defect rate, schedules, et al. Zone plate structures generally function well with only a limited number of zones, although the central missing zones diameter should be smaller than half of the exterior diameter of the zone plate, to avoid formation of deleterious side lobes in the diffraction pattern around the focus points. It is possible to omit some of the inner/central zones of greatest thickness, and longest deposition time. For some applications, such as for scanning X-ray microscopes, a central beam blocker is typically used to block the central part of the FZPs, therefore, rendering it unnecessary to deposit all thick inner zones. For example, in this embodiment, each column 151 acts as a central support for the nanolaminate 171 defining the Fresnel zones of the FZP, and the column forms a non-diffractive core of the FZP.

The schematic transverse cross-sectional view shown in FIG. 3, which is taken through plane A-A of FIG. 2 shows schematically the diffractive line pattern formed by a nanolaminate 171 comprising a sequence of m layer stacks (M2, M1)$_1$, (M2, M1)$_2$ ... (M2, M1)$_m$, wherein (M2, M1)$_m$ is the thinnest pair of layers/pair of zones. The column 151 formed by the substrate material defines a central non-diffractive core of the FZP, and the first/thickest deposited layer can be any zone of number n, provided that the thicknesses of the sequence of alternating layers M1/M2 (or layers M2/M1 as illustrated) matches the specified diffractive zone structure of a FZP starting with the zone number n and zone widths decrease from there according to the specified diffractive line pattern for the FZP, or other form of diffractive optic, being fabricated.

For example, Fresnel zones are circular crowns of inner radius $R_n$ and outer radius $R_{n+1}$, defined by the formula is $R_n=\text{sqrt}(n\lambda f+n^2\lambda^2/4)$, where f is the focal length of the first order focus, X is the wave length, and n is the ring index. As is well known, alternatively, Fresnel zones may be defined by a good approximation to this formula, such as $R_n=\text{sqrt}(n\lambda f)$, or other formulae to define fractal zone plates or composite zone plates. For other forms of diffractive optics, the appropriate formula would be used to define thicknesses of the sequence of deposited layers to match the appropriate zone width specifications of the diffractive device that is being targeted, i.e. to form a specific diffractive line pattern.

By way of example, wherein the nanolaminate 171 comprises a sequence of m layer stacks (M2, M1)$_1$, (M2, M1)$_2$ ... (M2, M1)$_m$, wherein (M2, M1)$_m$ is the thinnest pair of layers/pair of zones, as described with reference to FIGS. 1 to 10, each stack (M1, M2) correspond to pairs of Fresnel zones, so, the stacks cover circular crowns extending from $R_n$ to $R_{n+2}$. Therefore, if we index with k the stack (M1, M2)$_k$, then k is indexing in fact pairs of Fresnel zones. Accordingly, depositing the sequence of layers comprises depositing said m layer stacks (M1, M2)$_1$, (M1, M2)$_2$ ... (M1, M2)$_m$, each layer stack having a thicknesses defining double Fresnel zone widths which match the structure of the Fresnel zone pairs starting with the pair of zones number n+1 and n+2, respectively, for the stack (M1.M2)$_1$, and continue by matching the thicknesses of stack (M1, M2)$_k$ with the thickness of Fresnel zone pairs n+2k−1 and n+2k, respectively, up to k=m.

At least thinner layers of the nanolaminate are deposited by Atomic Layer Deposition (ALD) or variations of spatial ALD or pulsed CVD. Sub-second deposition cycles became possible with spatial ALD systems, as described e.g. by S. M. George, Chem. Rev. 110, pp. 111-131, 2010 or K. Sharma et. al., J. Vac. Sci. Technol. A33(1), p. 01A132-1, 2015), and pulsed chemical vapor deposition (CVD) techniques, as described e.g. by D. J. H. Emslie et. al., Coordinative Chemistry Reviews, Vol. 257, 23-24, PP. 3282-3296, 2013) For faster, lower cost processing, CVD may be used for depositing the thicker inner layers.

Figure 4:
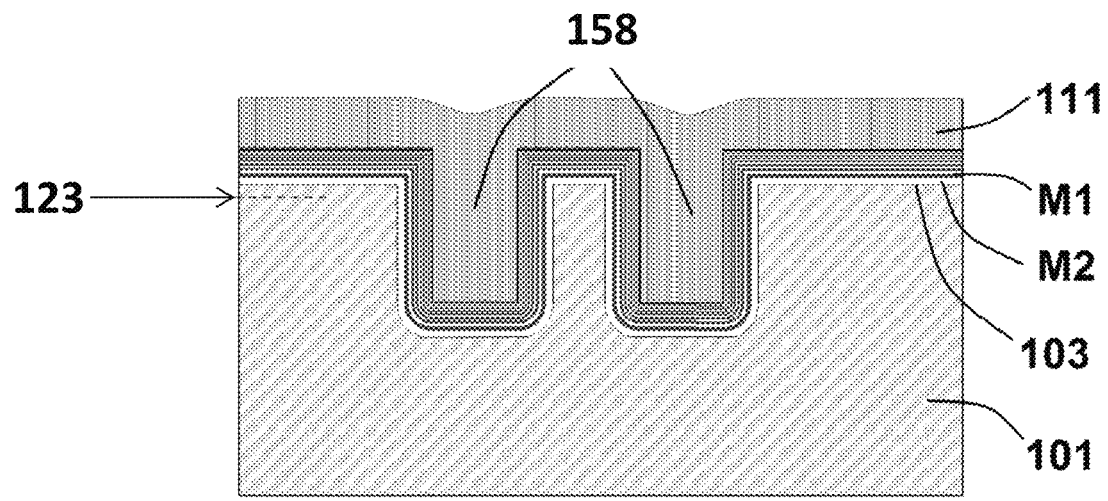
FIG. 4 shows a schematic vertical cross-sectional view through the device structure of FIG. 2 after depositing a filler and planarization material 111 onto the ALD-deposited central column and filling the adjacent gap surrounding the column and nanolaminate layers.

FIG. 4 shows the next step in the fabrication sequence. After deposition of the nanolaminate defining the specified pattern of diffractive zones for the FZP, a filler/planarization material 111 is deposited to provide a filler to fill the remaining gap or void 158 left within the recess surrounding each column, and to planarize the substrate. Such planarization materials are well known in the electronics and MEMS industry, e.g. spin-on glass, polymers, flowable oxides, etc., and can be deposited by spin-on coating and thermal curing. Alternatively, filling the surrounding gap can be done by electroplating a metal such as Au, Pt, Cu, Ni or other, preferably of high Z and atomic mass, in which case the metal can form an aperture, or part of an aperture surrounding the diffractive zone pattern which can be integrated directly on the zone plate structure. In that case, a plating base film will need to be deposited prior to electroplating. Optionally, a photoresist mask can be used to limit the electroplating to some targeted areas.

Figure 5:
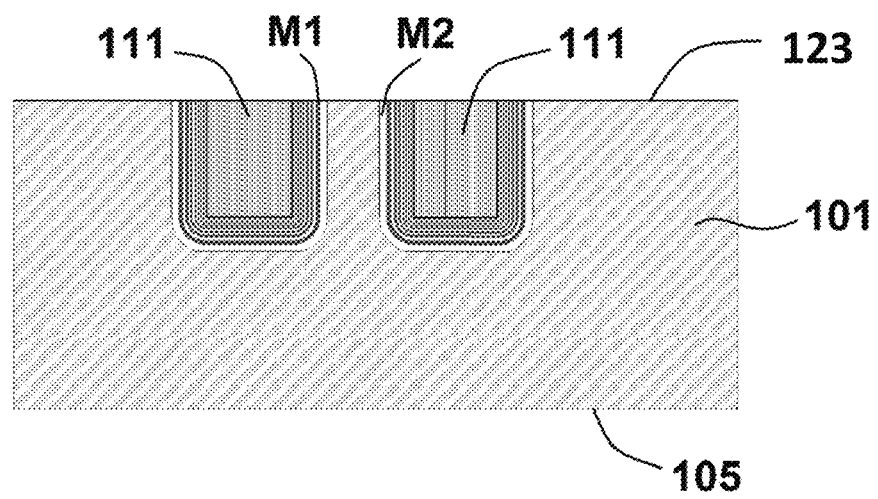
FIG. 5 shows a schematic vertical cross-sectional view through a device structure of FIG. 4, after polishing flat the structure and stopping at the level of the surface of the initial substrate material 101, or beyond it, to form a flat surface 123.

FIG. 5 shows the next step in the processing sequence: i.e. a first planarization by polishing the top of the substrate. Ideally, the polishing process can be conducted until the first-deposited layer of material M1, and the smoothing layer, is exposed and polished off from the flat/horizontal top surface 103 of the substrate 101. Typically, polishing processes involved are mostly mechanical, but can have a chemical component too, i.e. one or more chemical-mechanical polishing steps, suitable for removing the materials of the planarization filler 111 and layers of materials M1 and M2, sequentially or not. For example, a polishing process that allows a polish stop on the first substrate material 101 is beneficial, if available. The polish stop in that case can be achieved through selective polishing properties of the slurry. Alternatively, a method that involves stopping the polish process through periodic checking or measurement of the progress of polishing through measurement of the remaining layer thickness can be used. In case the precursor diameter or sidewall slope or side wall roughness is not ideal near the top of the sidewall, e.g. near the top edge of the column at surface 103 of the substrate 101, the polishing process can continue until that portion is polished off, i.e. removing some the original surface 103 of the substrate, to reach a flat-polished surface 123 beyond 103. For example, the first planarization polishing can be continued until reaching the top side of the precursor structure meeting designed geometrical specifications of e.g., diameter, cylindricity, side wall slope or cross-sectional shape of the column.

Figure 6:
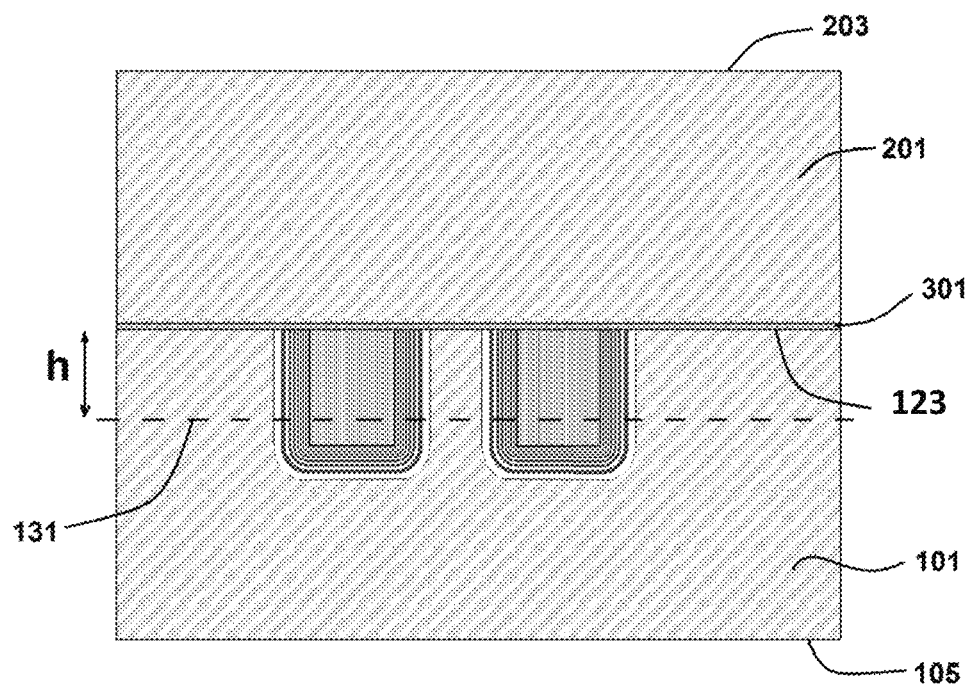
FIG. 6 shows a schematic vertical cross-sectional view through the device structure of FIG. 5, after bonding a carrier substrate 201 to the initial substrate, using a bonding layer 301.

FIG. 6 shows the attachment (bonding) of a carrier substrate 201 to the first substrate 101, through an intermediate layer 301. The attachment can be made through wafer bonding, such as anodic bonding, thermo-compression bonding, or adhesive bonding, or even direct bonding, in which case an intermediate layer may not be necessary. An intermediate layer 301 comprising a bonding layer or adhesion layer is preferable if the direct bonding of the two parts by themselves is expensive or low-yielding. Typical examples of adhesion layers for anodic bonding are a sandwich of Me/Si$_3$N$_4$/SiO$_2$ layers, where Me is a metal and the insulation layer is necessary to electrically insulate the two substrates. By way of example, the metal is typically Al, Ni, W, Ti, Ti—Au, Cu, etc. and other examples of bonding metals are well known by those skilled in the art. The metal is used to spread the electric field uniformly across the bonding surface 123. Uniformity in electric field is desirable to facilitate anodic bonding processes between the substrates and to avoid undesirable local electric field "hotspots" as a result of the presence of the high Z metals (e.g. W, Ir, Au, etc) which form part of the zone plate structures, or, in the case that an electroplated metal is used as planarization/filler material 158. For the case of thermo-compression bonding, an alloy-forming material with the substrate (typically Si) is sought, such as Au (known to form a low-melting-temperature Au—Si eutectic). For adhesive bonding, the adhesion layer can be a polymer glue, or a combination of membrane-making materials (e.g. Si, Si$_3$N$_4$, SiO$_x$N$_y$, SiC, or other carbon-based materials) and a polymer glue as familiar to those skilled in the art of wafer bonding or temporary wafer bonding.

Figure 7:
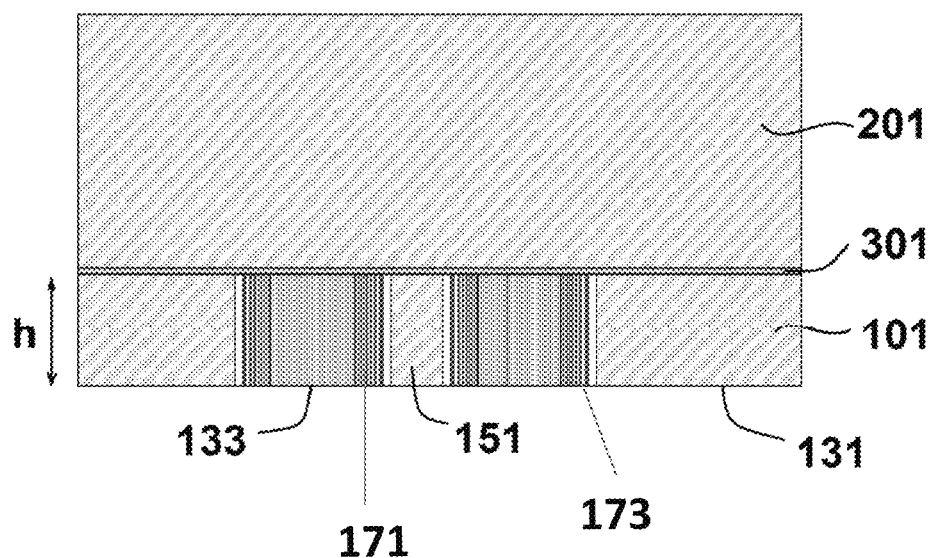
FIG. 7 shows a schematic vertical cross-sectional view through the device structure of FIG. 6, after polishing off part of the first substrate 101, with a polish stop at the level of the last-deposited ALD layer (inclusive) or beyond it, to form a flat surface 131.

Referring to FIG. 7, after the bonding step, the material of the initial substrate 101 is thinned, e.g. polished off, until the ALD stack of layers is reached. At that point, the ALD stack of alternating high and low refractive index materials at the bottom of the recess 157 is removed, until a surface 113 of the remaining part of the filling of planarization material 111 surrounding the ALD stack of layers is exposed as a polish stop. Polishing continues until surface 131 is reached to provide a FZP of the required height h. The remaining part of the substrate 101 and the filler 133 forms a frame or membrane supporting the diffractive optic and the thickness of the membrane is equal to the height h of the diffractive line pattern. The height h, i.e. the distance h in the direction of propagation, can be in the range from few micrometers to hundreds of micrometers. In case the precursor diameter or slope or side wall roughness is not ideal on a portion near the bottom of the column formed in the substrate 101, polishing can continue until that portion is polished off. This second polishing of the second (back) surface, combined with the first polishing to planarize the first (front) surface of the precursor, as described above, allows for selection of the desired or best part of the precursor height to be used for the diffractive optic element. Typically, the height of the precursor column is high enough so that if the precursor geometry is not ideal along its entire height, the first and second polishing steps are used to select a portion of the required height h, such as the middle portion. The second planarization polishing can be continued until reaching a region of the precursor structure which meets the designed geometrical specifications of diameter, cylindricity, side wall slope or cross-section shape. For example, prior to planarization, the dimensions of the column 151 would be first characterized by measurements and a portion of the required height h would be selected where the diameter and slope meet design requirements. That portion should then be chosen to remain after the first and second planarization processes.

Figure 8:
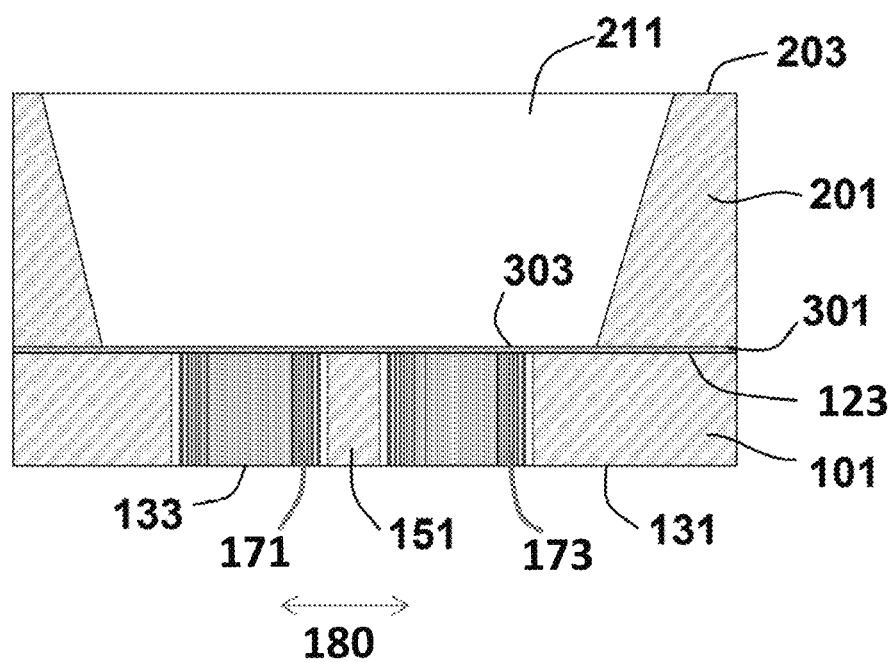
FIG. 8 shows a schematic vertical cross-sectional view through the device structure of FIG. 7, after opening a window 211 from the back side in the material of the carrier substrate 201, with an etch stop at the surface 303 of the bonding layer 301, to form a membrane-based diffractive optical device.

After backside polishing, a window 211 is opened in the carrier substrate 211, e.g. selectively etching away part of the carrier substrate 201 to form a layer or a membrane hosting the diffractive structure, with a central region 180 comprising support column 151 and the surrounding nanolaminate 171 defining the diffractive line pattern, as shown schematically in FIG. 8.

For this step, coating of exposed surfaces 203 and 131 of the bonded and polished substrates with an etch-resistant film is preferred. For example, a layer of Si$_3$N$_4$ deposited by LPCVD or PECVD would be a suitable etch resistant film. This step would preferably be followed by opening of access to the device by front-to-back alignment contact lithography and a RIE process to etch a suitable window in the etch-resistant film (e.g. the Si$_3$N$_4$ layer) on the carrier substrate side, followed by anisotropic chemical etching of the carrier substrate 201. For example, the material of choice for carrier substrate 201 may be silicon. Alternatively, the back side etching can be performed through lithography in a thick resist layer, or lithography through a resist and RIE Bosch process-resistant hard mask, such as a Al, SiO$_2$, Ni (as non-limiting examples and where other examples of hard mask material are well known by those skilled in the art), followed by a deep dry etching process, such as the Bosch process, to reach the surface of the diffractive optics structure or, as illustrated in FIG. 8, the surface 303 of the interlayer 301 used for bonding.

Figure 9:
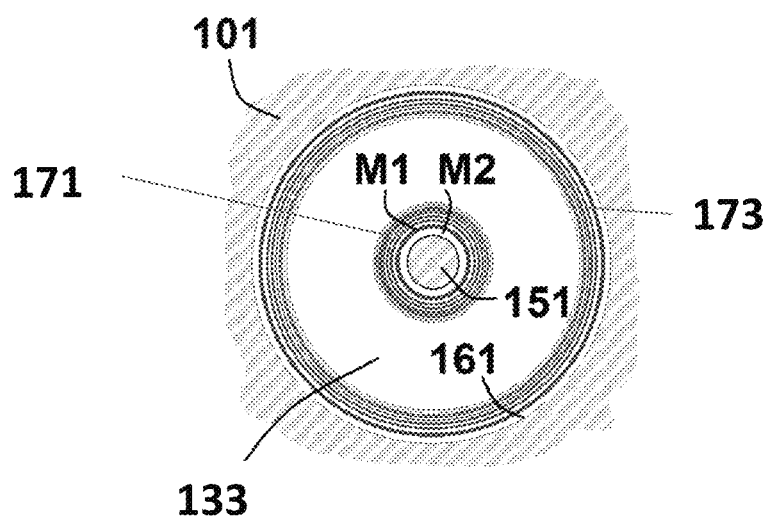
FIG. 9 shows a schematic plan view of the underside of the device structure of FIG. 8, showing filler material 133 surrounding the nanolaminate 171 defining the zones of the diffractive line pattern of the FZP.

FIG. 9 shows a schematic view of part of the underside of the structure of FIG. 8 to show the column 151 which forms the core support of the diffractive optic surrounded by the nanolaminate 171 comprising the sequence of alternating layers M1 and M2 defining the diffractive zones of the FZP, the surrounding part of the filler 133 and residual nanolaminate 173, supported in a frame of the remaining part of the substrate 101

Figure 10:
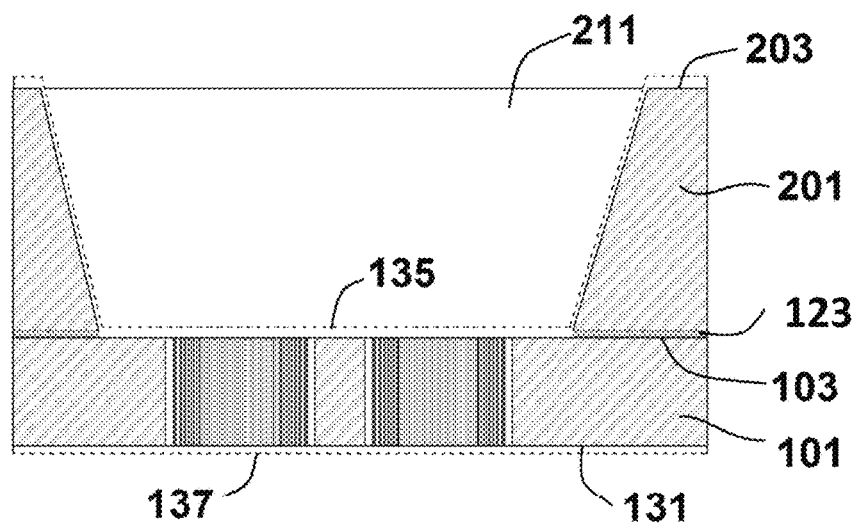
FIG. 10 shows a schematic vertical cross-sectional view through the device structure of FIG. 8, further comprising layers 135 and 137.

Post-processing, such as, CVD deposition of a protective layer, e.g. layers 135 and 137 in FIG. 10, over exposed surfaces of the composite membrane structure can optionally be included. This protective layer can have suitable mechanical properties, such as, for mechanically strengthening the membrane or flattening out compressive stress induced buckling (stress engineering); thermal properties, such as, for dissipation of heat from the structure during its operation in the beam, which can heat and deform it; electrical properties, such as for dissipation of charges; thermo-mechanical properties, such as, for mitigation of thermal expansion properties in the composite membrane; or combinations thereof. The nature of the protective layer film and the deposition process (e.g. by CVD) should to be chosen to be compatible with the materials present in the structure before coating to achieve the desired mechanical, thermal, electrical, properties. Such a layer can also have the form of an engineered layer or multiple layers to host integrated functionalities such as passive or active components for beam monitoring, such as flux monitoring, alignment, temperature or safety switch off, or to host conductive leads to contact circuit devices integrated in the substrate or carrier, for these functionalities.

Post processing may also comprise reshaping or trimming individual diffractive optics elements. For example, it may be required to shape the precursor and ALD layers by removing end-rounded ALD layers on elongated ridges, or for precursor forms with angled sidewalls, reshaping edges of the ALD layers. Optionally, additional processes, such as ion implantation for stress and buckling compensation, or selective etching of the remaining material of the initial substrate 101, or of the bonding layer 301, or of any of the materials M1 and M2 of the optical diffractive structure to fine-tune or enhance its optical performance can be performed. For example, removal of the bonding layer may be desirable to achieve a desired property (e.g. lower absorption) in the final diffractive optics device. Post processing can be performed for enhancing the device functionality by the integration with other devices, for example, building a beam blocker on top of a FZP as used for scanning X-ray microscopy purposes or integrating a FZP on a micro-electro-mechanical system (MEMS) device, for alignment or fine positioning manipulation within larger devices or systems. Such functionalities can be integrated along with other functionalities already mentioned, with part of their circuitry present in the substrate 101 or carrier 201.

Without a sidewall smoothing process, the thickness of the thinnest functional zone of the diffractive optic would be limited by the average roughness of the sidewalls, which is usually tens or hundreds of nm for most etching processes for high aspect ratio columns. In a variant of this embodiment, to smooth the side walls, the deposition can start with a thick ALD layer (any of M1 or M2, or even a different ALD layer Mx), which can be annealed to a flowing or roughness smoothing point, to reduce the initial wall roughness and thereby reduce the effect of the wall roughness or non-uniformity on the first layer/zone. Alternatively, a smoothing layer comprising BPSG, PSG, or a polymer layer can be provided, as described above.

The order of deposition of layers M1 and M2 may be reversed. That is, the use of material M1 (high absorption or refractive index) for the first deposited zone is not mandatory. The deposition can start with material M2 (low absorption or refractive index), since the principle of Babinet (e.g. see M. Born and E. Wolf, Principles of Optics, Sixth edition, Cambridge University Press, 1998, p. 381) assures that the diffraction properties of the resulting structure with reversed M2-M1 order will be the same as for a device deposited with the non-reversed M1-M2 order, i.e. starting with M1, then M2.

The choice of zone widths translated into the values of the deposited layers thickness in the sequence of depositions has to reflect the targeted functionality of the device. The following example illustrates the focusing of X-rays using FZPs using the inventive method. Let's assume that after the fabrication of the cylindrical column 151 in substrate 101 (i.e. the dimensions of the column after all smoothing procedures have been applied) the radius of that column is $r_c$, and that the targeted FZP should have a focusing distance f at a prescribed X-ray wavelength of λ. For a FZP to function effectively, the basic relationship $$r_n = \sqrt{n\lambda f + \frac{n^2\lambda^2}{4}} \approx \sqrt{n\lambda f} \tag{1}$$

has to be fulfilled, where n is the index of the Fresnel zone, counted from the center of the FZP to the outermost (thinnest) zone. Therefore, an index for the thinnest deposited, outermost zone, $n_c$, can be established as $$n_c \approx \left[\frac{r_c^2}{\lambda f}\right], \tag{2}$$

where the brackets represent the rounding towards an integer value of the contained argument.

Alternatively, if the diffractive device is not a FZP, or is a FZP of a special configuration, the deposited material thicknesses are not required to follow relation (1). The deposited material thicknesses would be defined by the appropriate zone width specifications of the diffractive device that is being targeted, i.e. to form a specific diffractive line pattern. By way of example only, other diffractive devices may comprise devices with equal thickness zones (equivalent to axicons), FZPs with missing zones (known as fractal zone plates), FZPs with composite design and others, as well-known to those skilled in the art.

In fabrication of the precursor structure comprising the array of columns within recesses, as shown in FIG. 1, each high aspect ratio column 151 is formed within a relatively wide cylindrical hole or recess 157. Thus, this structure places less restrictions of the etch process, i.e. the hole or recess surrounding the column has a lower aspect ratio, which may therefore be defined by conventional lithography and etching processes. The surrounding hole or recess facilitates measurements for non-destructive characterization of the dimensions and other parameters of the columns. Also, the region 107 of the substrate around sidewalls 161 of each hole 157 provides a reinforcing region during subsequent processing.

For example, deposition on columns 151 of the nanolaminate defining the FZP zone pattern overcomes one of the drawbacks of fabrication of high aspect ratio diffractive optics using deposition within high aspect ratio holes. Deposition within high aspect ratio holes requires accurate characterization of the dimensions, e.g. diameter, sidewall tilt and surface roughness of a cylindrical hole, with an accuracy of no less than half of the thinnest targeted functional zone width, which is typically ~10 nm or less. This accuracy is difficult to characterize in holes of the required depth and aspect ratio for X-ray diffractive optics, except by destructive techniques.

Since the nanolaminate does not entirely fill the recess 157, and leaves a gap or void surrounding the nanolaminate, as illustrated in FIG. 4, after deposition of the nanolaminate comprising the sequence of alternating layers of M1 and M2 defining the zones of the FZP on the sidewall of each column, a filler or planarizing layer 111 is deposited over the wafer, to fill any gaps or voids left in the surrounding hole around the column and the nanolaminate, followed by planarization by polishing, e.g. one or more chemical mechanical polishing steps, as illustrated schematically in FIG. 5, to expose top surface 103, or polish beyond it, to reach a surface 123, where the precursor geometry fits the shape specifications. A carrier wafer 201 is then bonded to surface 123 with an intermediate layer 301, as illustrated in FIG. 6. Then, the underlying substrate is removed leaving a planarized surface 131 as illustrated in FIG. 7. To facilitate these planarization steps, and thinning of the structure to a specified height h defining the aspect ratio of the resulting diffractive optic structure, various forms of etch stops or fiducials easing the accurate depth measurement during sequential polishing steps (e.g. V-grooves etched into the initial surface 103) may be incorporated into the process.

A window 211 is then opened from the surface 203 of the carrier substrate 201 to expose the surface 303 of the intermediate layer 301, as shown schematically in FIG. 8, leaving the diffractive optic supported in the surrounding substrate 101 which is bonded to the carrier substrate 201 by intermediate layer 301. As shown in the schematic cross-sectional view in FIG. 8, the resulting device structure comprises a core 151 of the substrate material 101, the surrounding nanolaminate 171 comprising the sequence of alternating layers of M1 and M2 defining diffractive lines of the diffractive optic, e.g. m layer stacks $(M2, M1)_1$, $(M2, M1)_2 \ldots (M2, M1)_m$ defining zones of an FZP, a surrounding filler material 133, an outer ring of a "residual" nanolaminate 173 and the remaining part of the substrate 101 which forms a supporting frame or membrane. Note that the nanolaminate 171 surrounding the core 151 forms the diffractive lines of the diffractive optics; the outer ring of residual nanolaminate 173 is a remaining part of the ALD deposited layers which was deposited on a sidewall 161 of the recess and does not necessarily form a functional part of the diffractive line pattern of the diffractive optic.

The process for opening a window typically uses a lithographic process to form a hard mask, followed by a selective chemical or reactive ion etching of the carrier substrate material. Other windows etching methods in the carrier substrate can also be used, such as laser drilling or machining, mechanical machining, ion beam etching, focused ion beam etching, chemical assisted laser etching, reactive ion beam etching (RIBE), chemical assisted ion beam etching (CAIBE), or combinations thereof. In the case that the first substrate is robust enough to support the second planarization and later, handling the optical devices, the carrier substrate can be removed in its totality.

Optionally, one or more additional layers 135 and 137 may be provided as illustrated schematically in FIG. 10, for example one or more protective layers. The protective layer or layers can have suitable mechanical properties, such as, for mechanically strengthening the membrane or flattening out compressive stress induced buckling (stress engineering); thermal properties, such as, for dissipation of heat from the structure during its operation in the beam, which can heat and deform it; electrical properties, such as for dissipation of charges; thermo-mechanical properties, such as, for mitigation of thermal expansion properties in the composite membrane; or combinations thereof. The nature of the protective layer film and the deposition process (e.g. by CVD) should to be chosen to be compatible with the materials present in the structure before coating to achieve the desired mechanical, thermal, electrical, properties. Such a layer can also have the form of an engineered layer or multiple layers to host integrated functionalities such as passive or active components for beam monitoring, such as flux monitoring, alignment, temperature or safety switch off, or to host conductive leads to contact circuit devices integrated in the substrate or carrier, for these functionalities.

A precursor structure comprising cylindrical columns within a surrounding recess such as a concentric hole, or other shapes columns such as linear mesas within a surrounding linear trench, can be produced by conventional lithography and etching processes.

A certain degree of complexity can be included for the tilt of the column sidewalls, such as a constant tilt, a gradual/curved tilt or even a pre-determined optimized shape tilt, e.g. for optimizing characteristic output measures of the device functionality, such as higher diffraction efficiency or resolution.

Formation of columns within recesses avoids the need for etching and characterizing high aspect-ratio holes as is required for some prior art process.

Since fabrication of the device structure starts with deposition of a thicker zone and ALD is known to smoothen the roughness while deposition proceeds, this sequence of deposition will help to smooth the subsequent depositional surfaces as later thinner layers/zones, or even the outermost, thinnest layer/zone, are deposited. However, the error accumulation from the initial depositions to the later depositions does tend to produce more significant thickness errors in the subsequent thinner layers/zones. Accordingly, fabrication of FZP on columns can benefit from providing an initial smoothing layer on each column, to reduce surface roughness (e.g. to provide an RMS surface roughness of half the thickness of the thinnest layer of the diffractive line pattern), prior to deposition of the M1/M2 layer sequence.

Figure 11:
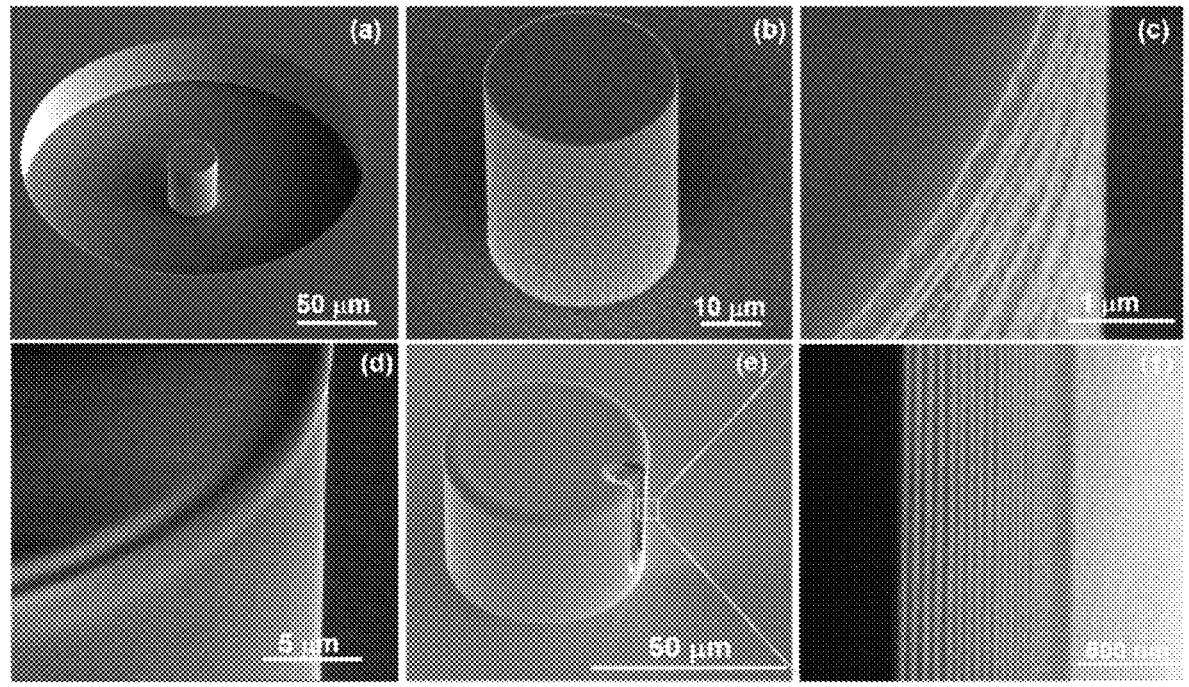
FIG. 11 shows electron microscopy images to illustrate steps in the fabrication process: a) as-etched Si pillar (column) within a cylindrical hole; (b) detail of the pillar; (c) enlarged view of sidewall of pillar, showing as-etched roughness; (d) sidewall of pillar after smoothing; (e) focused ion beam cross-section of a pillar after sequential ALD of layers of the nanolaminate; (f) detail showing a nanolaminate comprising a sequence of alternating layers of first and second materials around the Si pillar.

FIGS. 11(a) to 11(f) show electron microscopy images to illustrate steps in the fabrication process for test device structures, starting with etching into the silicon substrate to provide a precursor structure comprising an array of cylindrical columns (which may be referred to as pillars), each column being surrounded by recess, and then applying a sidewall smoothing procedure. FIG. 11(a) shows an as-etched column within the recess. As apparent from this image, the cylindrical column has a diameter of e.g. 25 μm, and is formed concentrically within a relatively large surrounding recess in the form of a cylindrical hole having a diameter of e.g. >200 µm, which can readily be formed by conventional lithography and etching processes. The surrounding recess facilitates characterization of dimensions of the column. FIG. 11(b) shows an enlarged view of the column. FIG. 11(c) shows the sidewall of column, showing as etched roughness; and FIG. 11(d) shows the sidewall of the column after sidewall smoothing. The method continues with atomic layer deposition (ALD) of a nanolaminate of the sequence of low and high absorption and refractive index materials around the columns, with well-controlled layer thicknesses, varying from few nm to micrometers to define the specified diffractive line pattern, e.g. according to Fresnel zone rules. FIG. 11(e) shows a focused ion beam cross-section of a column after sequential ALD of the nanolaminate layers comprising an alternating sequence of layers of $Al_2O_3$ and $Ta_2O_5$ of specific thicknesses defining the specified diffractive zone pattern. FIG. 11(f) shows an enlarged cross-sectional view the sequence of layers of first and second materials, e.g. $Al_2O_3$ and $Ta_2O_5$ layers, of the nanolaminate.

Figure 12:
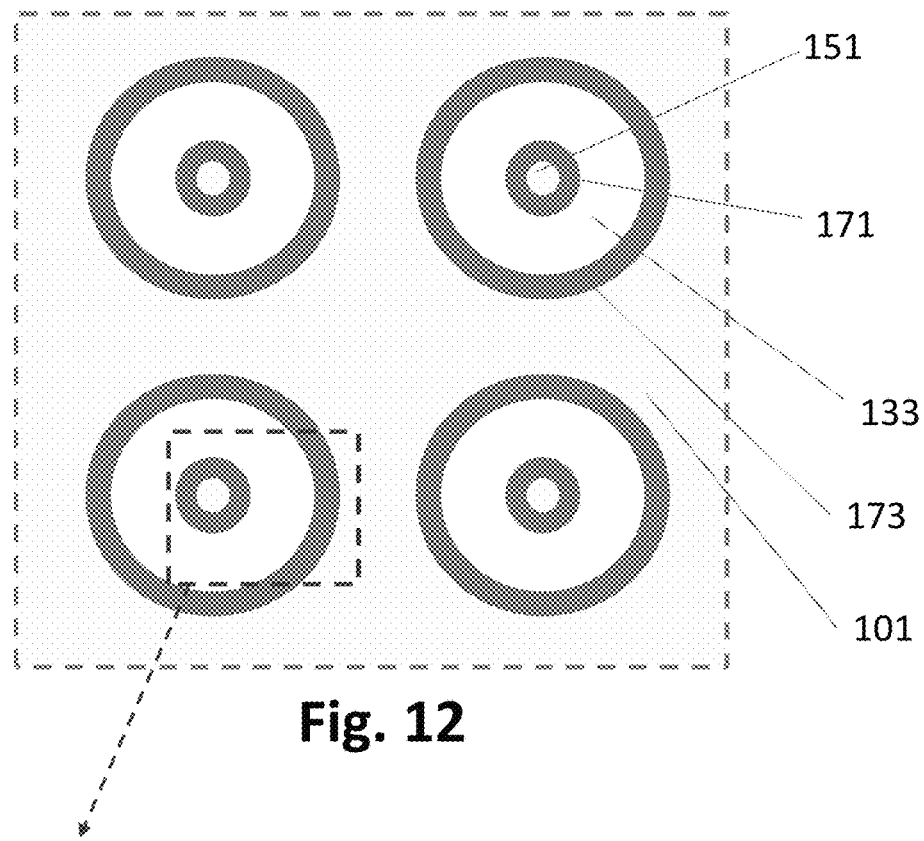
FIG. 12 shows a schematic plan view of part of an array of diffractive optics, after planarizing and polishing, comprising four diffractive optics supported by a membrane comprising the surrounding substrate.
Figure 13:
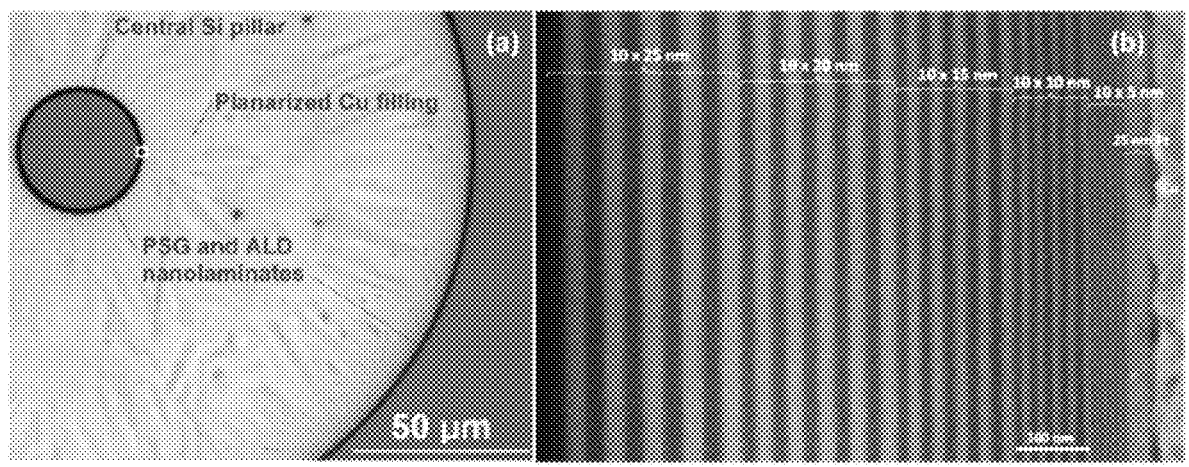
FIG. 13 shows microscopy images showing top view details after planarization and polishing (a) optical microscopy detail of Si pillar (column) with a PSG smoothing layer and ALD nanolaminate layers, surrounded by filler comprising Cu; (b) electron microscopy image of nanolaminate layers on the edge of a Si pillar (position delineated with a white square in (a)), with thinnest (5 nm) deposited layers visible.

After deposition of the ALD nanolaminate, the remaining void surrounding the ALD layers is filled with a suitable filler and planarization material, such as, a copper (Cu) filling, or a non-metallic filling, and the wafer is then polished to expose upper surfaces of the ALD nanolaminate and filler surrounding each central silicon pillar (i.e. column), embedded in the remaining part surrounding Si substrate, as illustrated in FIGS. 12 and 13. For example FIG. 12 shows a simplified schematic top view of a structure comprising a membrane formed by the remaining part of the silicon substrate 101 hosting four diffractive optics, each comprising a central column 151 formed by part of the silicon substrate, the nanolaminate 171 comprising the sequence of layers of materials M1 and M2 deposited on the sidewall of the column, which defines the specified diffractive zone pattern, the surrounding filler 133, and the residual part of the nanolaminate 173, which was deposited on the sidewall of the recess. FIG. 13(a) shows an electron microscopy image of the top view of part of one of the device structure after planarization and polishing showing detail of the Si column with PSG smoothing layer and ALD nanolaminate layers, surrounded by filler comprising Cu. FIG. 13(b) shows an electron microscopy image of the nanolaminate layers on the edge of a Si column (position delineated with a white square in FIG. 13(a)), with the thinnest (5 nm) layers visible. A 25 nm layer of Pt is provided before deposition of the copper filler.

Figure 14:
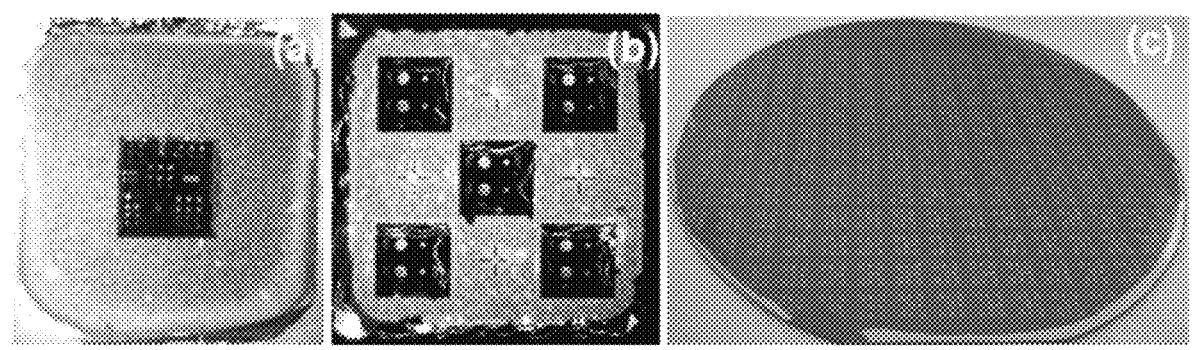
FIG. 14 shows photographs of a back side view of chips comprising zone plates embedded in Si membranes: (a) 2 cm×2 cm chip with a 5 mm×5 mm membrane; (b) 6 mm×6 mm chip with five 800 μm×800 μm membranes; (c) a wafer with 160 dies.

FIG. 14(c) shows an example of a silicon wafer comprising 160 dies, containing thousands of devices produced by this method. It illustrates how a large number of zone plates or other diffractive optics can be batch-produced this way on one wafer, thus minimizing the processing costs per device. These images demonstrate that potential hurdles, such as, fabrication of very smooth, "perfect" cylindrical precursors and the deposition of the sequence of layers of high/low refractive index material with precisely controlled layer thicknesses for the diffractive lenses, were successfully overcome. In this example, the roughness of cylindrical precursors' sidewalls after smoothing was measured as 0.61 nm (rms) and nanolaminate layers down to 5 nm thicknesses were achieved as seen in FIG. 11(b). Integration of the various individual fabrication steps into one robust fabrication sequence was proven and adequate metrology techniques were established for each fabrication step.

After completion of wafer processing, the individual dies are singulated to provide individual chips, each containing many diffractive optic devices. For example, FIGS. 14(a) and 14(b) shows photographs of a back side view of singulated silicon dies (device chips) containing one or several 21 µm thick Si membranes with dozens of embedded nanolaminate test devices. By way of example, FIG. 14(a) shows a die of size 2 cm×2 cm with a plurality of zone plates embedded in a 5 mm×5 mm Si membrane; and FIG. 14(b) shows a 6 mm×6 mm chip with zone plates embedded in five 800 µm×800 µm Si membranes.

For fabrication of FZP, there are advantages of starting with a cylindrical column within a cylindrical recess, in that one starts with deposition of the thicker zones and the deposition process (ALD) also progressively evens out eventual roughness non-uniformities of the central cylindrical column, thus improving its roughness while reaching the thinnest zones. Another advantage is that if the filling material is a metal (in most cases having a higher thermal expansion coefficient than Si), then during various heating processes necessary for subsequent processing, it was observed that the hole in the metal filler expands too and therefore does not exert deforming pressure onto the nanolaminate sequence of M1/M2 layer pairs. Since a larger diameter recess surrounds the column, this also places less restrictions on the lithography, which can be standard contact lithography, followed by any suitable etching process to remove material of the substrate from the recesses to define the columns.

A precursor structure comprising an array of columns also mitigates another issue with using precursor structure comprising an array of high aspect ratio cylindrical holes, in that, after deposition of the nanolaminate layer sequence of materials M1 and M2 defining the diffractive line pattern of the diffractive optic, the remaining central hole needs to be filled. Filler materials which are metals, such as copper, have a much higher coefficient of thermal expansion than silicon. Therefore, in practice, where the substrate is a silicon wafer, it was observed that during subsequent process steps that require heating of the wafer, e.g. including simple photoresist backing for lithography, and any subsequent treatments or post-processing, if the filler is a metal such as copper with a higher coefficient of expansion than the substrate material, the filler expands and compresses the surrounding nanolaminate comprising the sequence of layers M1 and M2, and the smoothing layer, potentially deforming or damaging the nanolaminate structure. In contrast, where the precursor structure comprises cylindrical Si columns surrounded by a cylindrical recess, and the filler is copper, it was observed that during heating, the ring of copper filler expands around the columns without deforming the nanolaminate forming the diffractive line pattern of the FZP. Although the copper filler may detach from the plating base during heating, upon cooling, it presses back where it detached and just keeps the FZP in place by mechanical gripping. This is effective, because the gripping is all along the height of the column.

A device structure of a second embodiment comprises a diffractive optic for higher order than binary diffraction. It is known that binary diffraction optics provide only a first order approximation towards a more complex, continuously-varying phase or absorption objects, such as typically embodied by kinoforms. A closer-to-continuum variation of optical path and phase differences in diffractive optics can be realized by providing a structure comprising a plurality of three or more materials in successive layers, M1, M2, . . . MN, rather than two materials M1 and M2, as described with reference to the device structures of the first and second embodiments which are based on a binary optics approach.

For the particular case of FZPs for X-rays, using three or more layers of materials, the e.g. material types of layers M1, M2, M3, or a plurality of layers M1 to MN, their thicknesses are calculated to match their absorption and phase shifting properties with the corresponding sub-zone widths and thicknesses. ALD is ideal for realizing such gradual phase transitions, using 3 or more ALD layers, if the multiple layers are compatible in terms of processing. The latter mainly involves the ALD processes being conducted at the same temperature and with non-mutual-reacting chemistries. While in diffraction optics with only two materials the order of materials M1 and M2 in the sequence is not important, in devices with 3 or higher number of materials, the order M1, M2 and M3 is important. For the case of FZPs for focusing as illustrated in FIG. 15A, the order of M1, M2, and M3 should be such that $\delta_1 < \delta_2 < \delta_3$. FIG. 15A shows a schematic cross-sectional view of a three-phase diffractive optics device of another embodiment, comprising a FZP for hard X-rays, using a three layer stack of materials M1, M2, and M3. FIG. 15B shows a resulting 3-step phase shifts approximation of the ideal continuous-varying phase shift in a kinoform as shown in FIG. 15C.

For the particular case of FZPs for X-rays, using a plurality of layer stacks of three or more layers of materials, the e.g. material types of layers M1, M2, M3, or a plurality of layers M1 to MN, their thicknesses are calculated to match their absorption and phase shifting properties with the corresponding sub-zone widths and thicknesses. ALD is ideal for realizing such gradual phase transitions, using 3 or more ALD layers, if the multiple layers are compatible in terms of processing. The latter mainly involves the ALD processes being conducted at the same temperature and with non-mutual-reacting chemistries. While in diffraction optics with only two materials the order of materials M1 and M2 in the sequence is not important, in devices with 3 or higher number of materials, the order M1, M2 and M3 is important. For the case of FZPs for focusing as illustrated in FIG. 15A, the order of M1, M2, and M3 should be such that $\delta_1 < \delta_2 < \delta_3$. FIG. 15A shows a schematic cross-sectional view of a three-phase diffractive optics device of another embodiment, comprising a FZP for hard X-rays, using a three layer stack of materials M1, M2, and M3. As illustrated in FIG. 15A, for deposition around a column that forms the central core 150 or 151 of the diffractive optic, for three-layer stacks (M1, M2, M3), for $\delta_1 < \delta_2 < \delta_3$, the sequence of deposition of layers for each diffractive line/zone is in the order (M1, M2, M3)$_1$, (M1, M2, M3)$_2$, . . . (M1, M2, M3)$_m$. FIG. 15B shows a resulting 3-step phase shifts approximation of the ideal continuous-varying phase shift in a kinoform as shown in FIG. 15C.

An example of a three material system to achieve such a variation of δ, i.e. wherein $\delta_1 < \delta_2 < \delta_3$, is M1=BN (boron nitride), M2=Al$_2$O$_3$ (aluminum oxide), M3=W (tungsten). The extension towards a larger number of materials and sub-zones is evident.

FIGS. 16A, 16B and 16C illustrates a device structure of yet another embodiment, with extension towards multiple materials M1, M2, M3, . . . , MN, for example, a FZP for hard X-rays, for which the relation $\delta_1 < \delta_2 < \delta_3 < \ldots < \delta_N$ has to be fulfilled. As illustrated in FIG. 17A, for deposition around a column that forms the central core 150 or 151 of the diffractive optic, in which each N-layer stack comprises (M1, M2, M3, . . . MN), for $\delta_1 < \delta_2 < \delta_3 < \ldots < \delta_N$, the sequence of deposition of layers for each diffractive line/zone is in the order (M1, M2, M3, . . . MN)$_1$, (M1, M2, M3, . . . MN)$_2$ . . . (M1, M2, M3, . . . MN)$_m$.

Thus, FIG. 16A shows a schematic cross-sectional view of a multiple-phase diffractive optics device of a fourth embodiment, comprising a FZP for hard X-rays, using multiple layers (N) stacks of materials M1, M2, . . . MN. FIG. 16B illustrates the resulting N-steps phase shift approximation corresponding to an ideal continuous-varying phase shift in a kinoform as shown in FIG. 17C. Thus, it will be appreciated that the method can be readily generalized for multilayer stacks of ALD films, M1, M2, . . . MN, to approach a smooth variation of absorbance of phase shifting across Fresnel zones, for an increase in efficiency and elimination of unwanted focusing/diffraction orders.

In the device structures of the embodiments described in detail above with reference to FIGS. 1 to 17, the diffractive optics comprise diffractive line patterns in the form of concentric circular zones, formed around a cylindrical column or pillar. By providing a precursor structure or form comprising a planar substrate in which is defined an array of cylindrical columns, batch-processing, using processes adapted from microelectronics and MEMS fabrication, allows for a large number of high aspect ratio diffractive optics, such as Fresnel Zone Plates, to be fabricated on a single wafer.

Alternatively, columns of various forms, e.g. non-circular pillars, such as square or hexagonal pillars, or columns of other prismatic polygonal shapes can be arranged to form a square, hexagonal (honeycomb) or any other type of array, for example, as illustrated schematically in FIGS. 17 and 18. FIGS. 17 and 18 show simplified schematic views of a membrane formed by a remaining part of the silicon substrate 101 hosting a plurality of diffractive optics, each formed around a central non-circular pillar 251, and comprising a nanolaminate 171 of a sequence of layers defining a specified diffractive zone pattern, surrounding filler material 133, and the residual nanolaminate 173. By way of example, zone plates with square or polygonal (e.g. hexagonal) geometries may be used as condenser lenses. Preferably, the precursor structures are structured to avoid sharp corners, which can be crack initiators, and taking into consideration mismatches of material properties, such as coefficients of thermal expansion and stress variations during processing. For example, cracks may be developed due to high tensile stress in the nanolaminate or presence of sharp convex corners. When necessary, the latter can be avoided by rounding the corners.

A precursor form 30 for an FZP of another embodiment comprises a substrate wafer 1001 having an array of a plurality of recesses 350, with a plurality of columns 351 defined in each recess 350, with an intermediate island 352 of the substrate between each recess 350, as illustrated in the schematic cross-sectional view in FIG. 19. For example, for a two-dimensional diffractive optic, if the precursor form 30 comprises an array of cylindrical columns 351 of the appropriate dimensions for forming FZP, similar to those of the first embodiment, the columns in recesses are structured for forming arrays of zone plates with at least a minimum distance between them. That is, while the precursor form illustrated in FIG. 1 has one cylindrical column in each cylindrical recess, the precursor form as illustrated in FIG. 19, for forming a two-dimensional diffractive optic, comprises a group of a plurality of cylindrical columns 351 formed within each cylindrical recess 350, with islands 352 of the substrate surrounding each recess 350. The larger islands 352 or reinforcing regions of the substrate around groups of columns provide a more robust substrate structure during fabrication, and e.g. to provide areas of the planar substrate surface that act as a polish stop layer for the chemical-mechanical polishing steps.

Other precursor structures, i.e. different geometric forms, such as an array of columns in the form of linear mesas, such as linear ridges, may alternatively be provided to fabricate diffractive optics of other forms.

For example, in a method of fabrication of a devices structure of an embodiment comprising a linear (one-dimensional) diffractive optic, the process starts by forming a precursor structure comprising an array of linear mesas within trenches etched into the initial planar substrate, followed by successive ALD depositions of pairs of layers M1 and M2, or sequences of layers M1, M2 . . . MN, to form device structures comprising diffraction gratings, coded linear apertures or linear focusing devices such as multilayer Laue lenses (MLLs). Thus, these devices can also be formed by batch-processing at wafer level using methods as disclosed herein.

For forming one dimensional diffractive optics, an example of a precursor form 40 of another embodiment is illustrated in the view shown in FIG. 20. The cross-sectional form is similar to that shown in FIG. 19, but the precursor form 40 etched in the substrate wafer 1002 has a linear structure, wherein the recesses comprise linear trenches 450, of rectangular cross-section, and a group of a plurality of the columns 451, in the form linear ridges of rectangular cross-section, are formed in each trench 450, to form a linear array. The larger islands 452 or regions of the substrate around groups of columns provide a more robust substrate structure during fabrication, and e.g. to provide areas of the planar substrate surface that act as a polish stop layer for the chemical-mechanical polishing steps. Alternatively, using a precursor form having a cross-sectional form similar to that shown in FIG. 1, wherein cylindrical columns or pillars are replaced with linear ridges 451 such as shown in FIG. 19, each linear ridge is formed within its own surrounding trench, and separated by intervening reinforcing regions from neighboring ridges and trenches.

It is also envisioned that columns and linear mesas of other geometries may be provided. For example, if the substrate is a silicon wafer, or other substrate material typically used in process technologies for electronics, MEMS and optoelectronics, existing well established lithographic and etching processes can be used to produce substrates comprising precursor structures comprising columns within recesses of many geometries with well-defined dimensions.

As another example, this way, arrays of FZPs can be fabricated, for instance, useful for X-ray lithography purposes. For example, structures have been described for UV lithography, e.g. H. Smith (H. I. Smith, J. Vac. Sci. Technol. B 14(6), November/December 1996, pp. 4318-4332) or patent WO 2004010228 A2 (R. Menon et. al., 2004, "Maskless lithography using an array of diffractive focusing elements"). The process disclosed herein to form arrays of FZPs extends the spectral domain of the technology towards higher photon energy or particle beams.

FIG. 21 shows a precursor structure for a diffractive optic of yet another embodiment, comprising a substrate 1003 wherein a precursor form 50 comprises a plurality of columns or ridges 551 with slanted walls within a surrounding trench. That is, the sidewalls of the columns or ridges extend at an angle α relative to the wafer plane (i.e. the plane of the surface of the substrate), so that the ridges have a cross-section of trapezoidal shape. Such slanted trenches can be produced in Si substrates cut in a certain crystallographic direction by wet chemical anisotropic etching (e.g. hot KOH solution) or by tilted RIE or FIB milling. For example, this form of structure can be used to form a diffractive optic which diffracts an X-ray beam out of the wafer plane, in a specified direction. Depositing sequential ALD layers M1, M2, or M1-M2- . . . MN onto the slanted walls would result in tilted gratings, suited for introducing X-rays into the plane of the substrate, useful for 2D optics in waveguides. In that case, after planarization, some trimming or reshaping of the structures may be required. For example, etching off part of the structures e.g. by combinations of lithographic and reactive ion etching or ion beam etching means, or focused ion beam, can be used to remove in-plane areas of sequential ALD-coated precursors, to allow the un-hindered in-plane propagation of the beam. Fabrication of devices structures of exemplary embodiments have been described in detail herein, by way of example only. In these examples, fabrication by batch-processing provides an array of a plurality of similar diffractive optics on each wafer.

In further embodiments, it will be appreciated that, for example, a plurality of diffractive optics of different forms or geometries may be fabricated on the same wafer. For example, it is also possible to produce linear devices on the same wafer as devices with circular or other symmetry, as illustrated schematically in FIG. 22. Or alternatively, in a wafer batch, some wafers may define an array diffractive optics of a first structure and other wafers define arrays of diffractive optics of other structures. Where optics of different structures are to be combined on a single wafer, a rule of combining different diffractive optics on a same wafer or batch of wafers is that the structures must share the same nanolaminate sequence of layers M1, M2, or layers M1, M2, . . . MN, i.e. including the same materials and thicknesses, to allow simultaneous processing. Thus, for example, as illustrated in FIG. 22, it is possible to combine one-dimensional optics formed around various forms of linear mesas 251, 451 and 551 within trenches, with two-dimensional diffractive optics formed around columns 151 within cylindrical recesses. For each of these structures comprises a diffractive line pattern defined by same nanolaminate 171 sequence of layers, and the same filler material 133 fills the remaining part of the recesses.

In the structures of some of the embodiments described above, the columns are cylindrical, i.e. with substantial vertical sidewalls, or with a small sidewall tilt angle. In other alternative embodiments, the shape of the columns may be varied.

For example, a certain tilt angle or other structuring of the side walls of structures used to deposit the sequential ALD layers is possible, allowable, and potentially advantageous to the functioning of the diffractive optical devices so fabricated, as long as the slant angle and other geometrical parameters of the resultant device are well controlled. For example, a tilt angle or slope of the sidewalls of the columns for the device structure of second embodiment, could lead to an enhancement of the focusing efficiency in a certain focus spot corresponding to a focus order towards which the tilted zone is pointing/blazing. Variations of the tilt angle close to this blazing direction can provide "guiding" of the hard X-rays or particle beams by channeling them in those directions, as long as the reflections on the adjacent zone walls are close to the total reflection condition. Recently, an analogous effect of guiding of X-rays through curved (similar to tilted) micro-channels was proven (T. Salditt, et al., Phys. Rev. Lett. 115, (2015), 203902), implying that such blazing through tilted zones is possible. This might alleviate the strict requirement for the fabrication of right angles and no wavinesss for the sidewall of the central column, leading towards a more technologically-achievable result for current generations of patterning processes.

In summary, a batch manufacturing process is disclosed for fabrication of diffractive optics, and in particular super-high aspect ratio diffractive optics suitable for high energy X-rays or gamma rays or particle beams. While examples are provided of nanolaminates of pairs of two materials M1 and M2, the method is extendable towards depositing nanolaminate sequences of more than two material layers, M1, M2, . . . MN, as described with reference to FIGS. 15 and 16, which enables the fabrication of kinoforms with stepwise graded index diffractive devices with single foci and of enhance diffraction efficiency. Additionally, refinement of the sequential deposition processes, combined with the use of higher order foci or composite zone plate architectures, has the potential to extend the imaging and focusing resolution down to as low as 1 nm. In principle, such high-resolution imaging could enable studies such as the measurement of crystalline deformations around single atom impurities. The methods disclosed herein may be applied for fabrication of diffractive optics, such as zone plates, for X-rays having energies in the range from 5 keV to several hundred keV, and for gamma rays which extend to higher energies, e.g. 400 keV or more.

For example, zone plates having a minimum diffraction line thickness of 15 nm having an aspect ratio greater than 100:1, with M1 $Al_2O_3$ and M2 $Ta_2O_5$ would provide some focusing effect of X-rays at ~8 keV, but would be far from ideal for 25 keV. An aspect ratio upwards of 475:1 would typically be required for such zone plates for efficient focusing of x-rays of 25 keV, for applications such as for X-ray microscopy or ptychography. As illustrated by other examples given in Table 1 (FIG. 23) with different ALD materials, for focusing or reshaping wavefronts of photons or particle beams having higher energies, significantly higher aspect ratios, e.g. ~1000:1 or ~10,000:1 may be required.

The methods disclosed herein adapt a sequence of standard wafer processing techniques, which are known from the micro-electronics or MEMS industry, to allow batch/parallel processing of several to hundreds or thousands of devices per wafer, and allow for a variety of optics design configurations to be processed simultaneously on the same wafer or on multiple wafers in a wafer lot. Fabrication of Fresnel zone plates and other diffractive optics by these methods also facilitates integration of devices comprising diffractive optics with other electronic and optoelectronic devices, to provide functions such as, actuation/positioning, scanning, beam monitoring and closed loop adaptive focusing The disclosed methods of fabrication of diffractive optics by batch processing offer one or more a number of potential advantages over known processes, for example:

The substrate/wafer may be a low cost substrate such as a single crystal silicon wafer, which allows for large wafer scale processing on e.g. 4 inch, 8 inch and larger diameter wafers.

An array of starting structures, e.g. an array of columns within recesses or linear mesas within recesses of many geometric forms can be formed with high precision using standard processing techniques, such as, lithography followed by reactive ion etching, or metal assisted chemical etching, or focused ion beam machining.

The precursor forms may comprise columns within recesses, e.g. columns such as cylindrical columns or tapered columns within surrounding cylindrical recesses, and other forms of columns or pillars of other geometries such as polygonal pillars within recesses, or the precursor forms may comprise rectangular columns or linear mesas, such as rectangular ridges within trenches, as suited for a specified diffractive optic design.

If required, a side wall smoothing process is provided to provide the precursor structures with the required dimensions and tolerances and having a surface roughness smaller than a fraction of the thinnest diffractive zone.

For deposition of a sequence of layers for binary or higher order diffractive optic, an isotropic deposition process, for example ALD, optionally combined with CVD for thicker layers, provides for a cycle or time-controlled deposition on the starting structures (precursor forms) of the nanolaminate comprising the sequence of alternating layers of M1, M2, . . . MN with controlled thicknesses.

The materials of each layer, their absorption and refractive index characteristics, and the thicknesses of each layer are selected according to the targeted design requirements, i.e. to define a specified diffractive line pattern for electromagnetic radiation or particle beams of a predetermined energy, such as, X-rays or gamma rays, or particle beams.

In subsequent processing, instead of conventional time consuming slicing of individual diffractive optics, unwanted parts of the layers of ALD and CVD deposited materials and the substrate are removed by one or more wafer scale planarization processes, such as mechanical polishing or chemical mechanical polishing, to leave planarized front and back surfaces of a substrate that comprises many dies, wherein the substrate of each die forms a membrane supporting an array of diffractive optics.

For example, the top polished substrate surface can be attached or bonded to a carrier wafer for removal of the underlying substrate, e.g. by thinning and polishing off the initial substrate/wafer to the point at which the ALD-coated columns is reached and the ALD material is totally or in part polished off from back surface.

The carrier substrate wafer can then be patterned as required, e.g. to open windows, using a process such as reactive ion etching or chemical etching, and form membranes on which the diffractive optics are supported or hosted.

Optionally, post-processing may include, for example, reinforcing the device with additional layers deposited by CVD methods for support or mechanical purposes (e.g. flattening of the membranes), etching away the initial substrate/wafer material or part or the entirety of one or several of the ALD-deposited layers, ion implantation for mechanical purposes, or enhancing the device functionality by the integration with another device or devices, for example, building a beam blocker on top of a FZP as used for scanning X-ray microscopy purposes or integrating a FZP on a micro-electro-mechanical system (MEMS) device, for fine positioning manipulation, or, for formation of in-wafer-plane optics (i.e. with beams propagating parallel to the substrate surface, rather than transverse to the surface).

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A device structure comprising:
   a diffractive optic comprising a specified diffractive line pattern, for photons or particle radiation of a prescribed energy;
   the diffractive optic being supported within a planar substrate comprising a substrate material;
   a first part of the substrate material defining a column having a sidewall providing a core support of the diffractive optic, and a second part of the substrate material defining a supporting frame around the diffractive optic;
   a nanolaminate formed on the sidewall of the column, the nanolaminate comprising at least first and second materials M1 and M2 having respective first and second complex indexes of refraction for photons or particle radiation of the prescribed energy, wherein the nanolaminate comprises a sequence of layers $(M1, M2)_1$, $(M1, M2)_2 \ldots (M1, M2)_m$ of thicknesses defining annular diffractive lines forming the specified diffractive line pattern around the column;
   a filler filling a region between the diffractive line pattern and the supporting frame; and
   first and second surfaces of the column, the diffractive line pattern around the column, the filler and the surrounding frame being planarized to form the planar substrate wherein an axial height of the diffractive line pattern in a direction of propagation is defined between the first and second surfaces.

2. A device structure comprising:
   a plurality of diffractive optics, each comprising a specified diffractive line pattern, for photons or particle radiation of a prescribed energy;
   each diffractive optic being supported within a planar substrate comprising a substrate material;
   a first part of the substrate material defining a plurality of columns, each having a sidewall providing a core support of one of the diffractive optics, and a second part of the substrate material defining a supporting frame around each diffractive optic,
   a nanolaminate formed on the sidewall of each column, the nanolaminate comprising at least first and second materials M1 and M2 having respective first and second complex indexes of refraction for photons or particle radiation of the prescribed energy, wherein the nanolaminate comprises a sequence of layers $(M1, M2)_1$, $(M1, M2)_2 \ldots (M1, M2)_m$ of thicknesses defining annular diffractive lines around each column forming the specified diffractive line pattern of one of the diffractive optics;
   a filler filling regions between each diffractive line pattern and the supporting frame; and
   first and second surfaces of each column, the diffractive line pattern around each column, the filler and the surrounding frame being planarized to form the planar substrate wherein an axial height of the diffractive line pattern in a direction of propagation is defined between the first and second surfaces.

3. The device structure of claim 2, wherein the nanolaminate defining the specified diffractive line pattern around each column comprises an ordered sequence of N layers of materials M1, M2, ... MN, where N is ≥3, the materials M1, M2, ... MN having an ordered sequence of different complex index of refraction at the prescribed wavelength or energy, thereby defining diffractive lines of an Nth-order diffractive optic, as an ordered sequence of layers $(M1, M2, \ldots MN)_1$, $(M1, M2, \ldots MN)_2$, $(M1, M2, \ldots MN)_m$ of specified thicknesses.

4. The device structure of claim 2, wherein the axial height h in the direction of propagation provides at least one of:
   an absorption difference between adjacent diffractive lines,
   a phase shift difference of $\pi$ between adjacent diffractive lines, and
   a phase shift difference of a designed fraction of r between adjacent diffractive lines;
   the thickness of thinnest deposited layers of the sequence layers is between 0.2 and 100 nm; and the aspect ratio of said axial height h to said layer thickness of thinnest deposited layers between 10:1 and 100,000:1.

5. The device structure of claim 2, wherein the materials and dimensions of the diffractive optics are selected for focusing of x-ray or gamma-ray electromagnetic radiation having a prescribed energy selected in a range from 8 keV to hundreds of keV.

6. The device structure of claim 2, configured for focusing of x-ray or gamma-ray electromagnetic radiation of a prescribed energy of several hundred keV.

7. The device structure of claim 2, wherein the nanolaminate defining the diffractive line pattern of each diffractive optic forms a Fresnel zone pattern around each column.

8. The device structure of claim 2, wherein the filler comprises a residual part of the nanolaminate formed on a sidewall of the supporting frame and a filler material filling a region between the nanolaminate defining the diffractive line pattern around each column and the residual part of the nanolaminate.

9. The device structure of claim 2, further comprising a carrier substrate supporting the planar substrate, the carrier substrate having windows exposing each diffractive optic, wherein the planar substrate and the carrier substrate form a membrane hosting the plurality of diffractive optics.

10. The device structure of claim 2, wherein for two-dimensional diffractive optics, the columns comprise one of: a column having a circular cross-section; a column having an elliptical cross-section, a column having a square cross-section, a column having a hexagonal cross-section, and combinations thereof.

11. The device structure of claim 2, wherein for one-dimensional diffractive optics, the columns have a rectangular cross-section to form linear mesas.

12. The device structure of claim 2, wherein the diffractive optics comprise at least one of: two-dimensional diffractive optics formed around columns having circular cross-sections; two-dimensional diffractive optics formed around columns having polygonal cross-sections; and one-dimensional diffractive optics formed around columns having rectangular cross-sections forming linear mesas.

13. The device structure of claim 2, wherein the sidewall of each column comprises one of:
   a sidewall angle of not more than +/−0.5 degrees from vertical;
   a specified sidewall tilt in a range of +/−5 degrees; and
   a shape wherein the sidewall tilt varies within −0.5 and +0.5 degrees from an average sidewall angle in the range of +/−5 degrees.

14. The device structure of claim 2, wherein the nanolaminate further comprises a smoothing layer between the sidewall of each column and the sequence of layers defining the specified diffractive line pattern around each column, the smoothing layer having an rms surface roughness no greater than a fraction of a thinnest deposited layer of the nanolaminate.

15. The device structure of claim 2, wherein:
    the first material M1 comprises at least one of platinum; iridium; tungsten; rhodium; osmium; zinc oxide; titanium oxide; tantalum oxide; hafnium oxide; and compounds, alloys and mixtures thereof; and
    the second material M2 comprises at least one of boron nitride; carbon; boron carbide; silicon dioxide; silicon nitride; silicon carbo-nitride; aluminum oxide; and compounds and mixtures thereof.

16. The device structure of claim 2, wherein the substrate material comprises crystalline silicon.

17. A method of fabrication, by batch-processing, of a device structure comprising a plurality of diffractive optics as defined in claim 2, comprising:
    providing a precursor substrate comprising an array of a plurality of columns, each column formed within a recess;
    depositing, on the sidewall of each column, the nanolaminate defining the annular diffractive lines of the specified diffractive line pattern;
    filling any remaining part of each recess with filler material; and
    performing front surface and back surface planarization to expose said first and second surfaces of the diffractive lines around each column and to thin the resulting structure to the required axial height h, thereby forming the plurality of diffractive optics as an array supported by said planar substrate.

18. A method of fabrication, by batch-processing, of a device structure comprising a plurality of diffractive optics as defined in claim 2, comprising:
    providing a precursor structure comprising an array of columns formed within recesses etched into a planar substrate, each column having a sidewall of specified vertical and lateral dimensions and sidewall angle;
    depositing on the sidewall of each column a nanolaminate comprising a sequence of alternating layers of different complex refractive index, the sequence of layers of the nanolaminate forming, around each column, annular diffractive lines defining a specified diffractive line pattern for a binary or higher order diffractive optic, for photons or particle radiation of a prescribed energy;
    providing a filler filling remaining surface voids;
    performing a front surface planarization to expose a first surface of each column, the diffractive line pattern around each column, surrounding parts of the filler and substrate forming the supporting frame;
    performing a back surface planarization to thin the substrate and expose second surfaces of each column, the diffractive line pattern around each column, surrounding parts of the filler and substrate forming the supporting frame;
    each column forming a core support for the nanolaminate defining the diffractive line pattern of one of the diffractive optics, wherein a height h of the diffractive line pattern between first and second surfaces in a direction of propagation provides at least one of a designed absorption difference and phase shift difference between adjacent diffractive lines of the diffractive line pattern.

19. The method of claim 18, wherein providing the precursor structure comprising an array of columns within recesses comprises providing columns of any one of the following forms:
    columns having a circular cross-section;
    columns having an elliptical cross-section;
    columns having a square cross-section;
    columns having a hexagonal cross-section;
    columns having a rectangular cross-section forming linear mesas,
    wherein each column has specified lateral and vertical dimensions and sidewall tilt to provide said core support of one of the plurality of diffractive optics.

20. The method of claim 19, wherein performing the first planarization comprises any one of: mechanical polishing, chemical polishing, chemical-mechanical polishing, reactive ion etching, ion beam polishing and a combination thereof, and wherein performing the second planarization comprises any one of: grinding, mechanical polishing, chemical polishing, chemical-mechanical polishing, deep reactive ion etching, laser-assisted chemical etching, ion beam polishing and a combination thereof.

* * * * *